United States Patent
Kim

(10) Patent No.: US 12,418,604 B2
(45) Date of Patent: Sep. 16, 2025

(54) ELECTRONIC APPARATUS, ELECTRONIC APPARATUS CASE, AND METHOD FOR MANUFACTURING ELECTRONIC APPARATUS CASE

(71) Applicant: Samsung Electronics Co., Ltd., Suwon-si (KR)

(72) Inventor: Yongwon Kim, Suwon-si (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 255 days.

(21) Appl. No.: 18/186,193

(22) Filed: Mar. 20, 2023

(65) Prior Publication Data
US 2023/0247122 A1 Aug. 3, 2023

Related U.S. Application Data

(63) Continuation of application No. PCT/KR2021/012906, filed on Sep. 17, 2021.

(30) Foreign Application Priority Data

Sep. 22, 2020 (KR) .................. 10-2020-0122195
Mar. 19, 2021 (KR) .................. 10-2021-0035755

(51) Int. Cl.
*H01Q 1/24* (2006.01)
*G06F 1/16* (2006.01)
(Continued)

(52) U.S. Cl.
CPC ........ *H04M 1/0266* (2013.01); *G06F 1/1628* (2013.01); *H01Q 1/24* (2013.01); *H05K 9/0024* (2013.01)

(58) Field of Classification Search
CPC ........ G06F 1/16; G06F 1/1628; G06F 1/1626; H01Q 1/24; H01Q 1/243; H01Q 1/38;
(Continued)

(56) References Cited

U.S. PATENT DOCUMENTS 5,256,856 A   10/1993  Takano et al.
5,497,937 A   3/1996   Yoshikawa et al.
(Continued)

FOREIGN PATENT DOCUMENTS

JP      5344108 B1     11/2013
KR      920019463 A    11/1992
(Continued)

OTHER PUBLICATIONS

Search Report issued in European Patent Application No. 21872884.8; Application Filing Date Sep. 17, 2021; Date of Mailing Feb. 6, 2024 (9 pages).
(Continued)

*Primary Examiner* — Tho G Phan
(74) *Attorney, Agent, or Firm* — CANTOR COLBURN LLP

(57) ABSTRACT

An electronic apparatus according to various embodiments disclosed in the present document includes a frame, a plate arranged on an inner side of the frame, an antenna member including a plurality of radiating units that transmit or receive an RF signal, a receiving space provided between the frame and the plate so that the antenna member is arranged between the frame and the plate and a plurality of joint parts, which are parts at which the frame and the plate are joined. A reinforcing joint part included in the plurality of joint parts may be positioned between adjacent radiating units from among the plurality of radiating units of the antenna member. Various other embodiments may be possible.

15 Claims, 18 Drawing Sheets

(51) Int. Cl.
*H04M 1/02* (2006.01)
*H05K 9/00* (2006.01)

(58) Field of Classification Search
CPC ...... H01Q 21/08; H04M 1/02; H04M 1/0216; H04M 1/0266; H05K 9/00; H05K 9/0024; B23K 26/21
See application file for complete search history.

(56) References Cited

U.S. PATENT DOCUMENTS

| | | | |
|---|---|---|---|
| 6,337,144 B1 | 1/2002 | Shimizu et al. | |
| 10,201,102 B2* | 2/2019 | Lee | H05K 5/0217 |
| 10,567,561 B2* | 2/2020 | Kang | H04M 1/18 |
| 10,665,926 B2 | 5/2020 | Kim et al. | |
| 10,691,168 B2 | 6/2020 | Huang | |
| 10,908,352 B1* | 2/2021 | Chen | G02B 6/0088 |
| 12,047,522 B2* | 7/2024 | Kim | H05K 1/14 |
| 12,176,620 B2* | 12/2024 | Lee | H01Q 9/045 |
| 2002/0151328 A1 | 10/2002 | Shin et al. | |
| 2003/0085211 A1 | 5/2003 | Ito et al. | |
| 2013/0320098 A1 | 12/2013 | Mukai et al. | |
| 2019/0070760 A1 | 3/2019 | Huang et al. | |
| 2020/0076057 A1 | 3/2020 | Leutheuser et al. | |
| 2020/0260605 A1 | 8/2020 | Lee et al. | |
| 2021/0273322 A1 | 9/2021 | Kim et al. | |

FOREIGN PATENT DOCUMENTS

| | | |
|---|---|---|
| KR | 950005430 A | 3/1995 |
| KR | 950018656 A | 7/1995 |
| KR | 0115493 Y1 | 4/1998 |
| KR | 19990045200 A | 6/1999 |
| KR | 20010057540 A | 7/2001 |
| KR | 20030017424 A | 3/2003 |
| KR | 200369702 Y1 | 12/2004 |
| KR | 20060025359 A | 3/2006 |
| KR | 20060074295 A | 7/2006 |
| KR | 100699408 B1 | 3/2007 |
| KR | 20130005164 A | 1/2013 |
| KR | 20130055910 A | 5/2013 |
| KR | 20160099264 A | 8/2016 |
| KR | 20170037464 A | 4/2017 |
| KR | 101775004 B1 | 9/2017 |
| KR | 101795491 B1 | 12/2017 |
| KR | 20190037739 A | 4/2019 |
| KR | 102079822 B1 | 2/2020 |
| KR | 20200034349 A | 3/2020 |
| KR | 20200063186 A | 6/2020 |

OTHER PUBLICATIONS

International Search Report with Written Opinion for International Application No. PCT/KR2021/012906; Application Filing Date Sep. 17, 2021; Date of Mailing Jan. 3, 2022 (15 pages).

* cited by examiner

[a]

[b]

ELECTRONIC APPARATUS, ELECTRONIC APPARATUS CASE, AND METHOD FOR MANUFACTURING ELECTRONIC APPARATUS CASE

CROSS-REFERENCE TO RELATED APPLICATION(S)

This application is a continuation application, claiming priority under § 365(c), of an International application No. PCT/KR2021/012906, filed on Sep. 17, 2021, which is based on and claims the benefit of a Korean patent application number 10-2021-0035755, filed on Mar. 19, 2021, in the Korean Intellectual Property Office, and of a Korean patent application number 10-2020-0122195, filed on Sep. 22, 2020, in the Korean Intellectual Property Office, the disclosure of each of which is incorporated by reference herein in its entirety.

TECHNICAL FIELD

Various embodiments disclosed in the present document relate to an electronic apparatus, an electronic apparatus case, and a method of manufacturing an electronic apparatus case.

BACKGROUND ART

Cases, which define external appearances of electronic apparatuses, are manufactured by various methods. Because a case is an important element that defines an aesthetic external appearance of the electronic apparatus, the case, to which various design elements are added, is also manufactured.

The case is a constituent element that supports various electronic components in the electronic apparatus. One of the important design elements is to design the case so that the case may protect various electronic components disposed in the electronic apparatus.

DISCLOSURE OF INVENTION

Technical Problem

The number of functions and the number of electronic components included in the electronic apparatus have been increased. However, because the size of the electronic apparatus gradually decreases, a space in which the electronic components need to be disposed becomes insufficient. In addition, a weight of a portable electronic apparatus is preferably decreased to provide convenience and usability for a user.

Under this circumstance, it is necessary to ensure rigidity of the case that defines an external appearance of the electronic apparatus.

Further, with the development of communication technologies, there is also a need to dispose a particular constituent element for performing communication functions so that the particular constituent element is disposed adjacent to an electronic apparatus case.

Various embodiments disclosed in the present document may provide a structure capable of ensuring rigidity of a case while disposing a constituent element adjacent to a side surface of the case for performing a communication function.

Solution to Problem

Various embodiments disclosed in the present document provide an electronic apparatus including: a frame; a plate disposed in the frame; an antenna member including a plurality of radiation parts configured to transmit or receive an RF signal; an accommodation space provided between the frame and the plate so that the antenna member is disposed between the frame and the plate; and a plurality of junction parts that is parts by which the frame and the plate are joined, in which a reinforcement junction part included in the plurality of junction parts is positioned between the adjacent radiation parts among the plurality of radiation parts of the antenna member.

Various embodiments disclosed in the present document provide an electronic apparatus case including: a frame; a plate disposed in the frame; a plurality of junction parts that is parts by which the frame and the plate are joined; and an intermediate member formed between the frame and the plate, in which a reinforcement junction part included in the plurality of junction parts is positioned between adjacent radiation parts among a plurality of radiation parts included in an antenna member disposed in an accommodation space provided between the frame and the plate.

Various embodiments disclosed in the present document provide a method of manufacturing an electronic apparatus case, the method including: forming a plate and a frame; temporarily assembling the frame to the plate so that a junction protrusion formed on one of the frame and the plate is inserted into a junction groove formed in the other of the frame and the plate; joining the junction protrusion and the junction groove; forming an intermediate member in a space between the frame and the plate; and cutting at least one of the frame, the plate, and the intermediate member, in which the cutting of the at least one of the frame, the plate, and the intermediate member includes forming an accommodation space in which an antenna member is disposed between the frame and the plate, and in which a reinforcement junction protrusion included in the junction protrusion and a reinforcement junction groove included in the junction groove is positioned between adjacent radiation parts among a plurality of radiation parts included in the antenna member disposed in the accommodation space.

Advantageous Effects of Invention

According to various embodiments disclosed in the present document, the antenna may be disposed on the side surface of the case so that the communication signal may be smoothly transmitted or received. In addition, it is possible to improve overall durability of the electronic apparatus case by ensuring rigidity of the portion where the antenna is disposed.

BRIEF DESCRIPTION OF DRAWINGS

In connection with the description of the drawings, the same or similar reference numerals may be used for the same or similar components.

MODE FOR THE INVENTION

Figure 1:
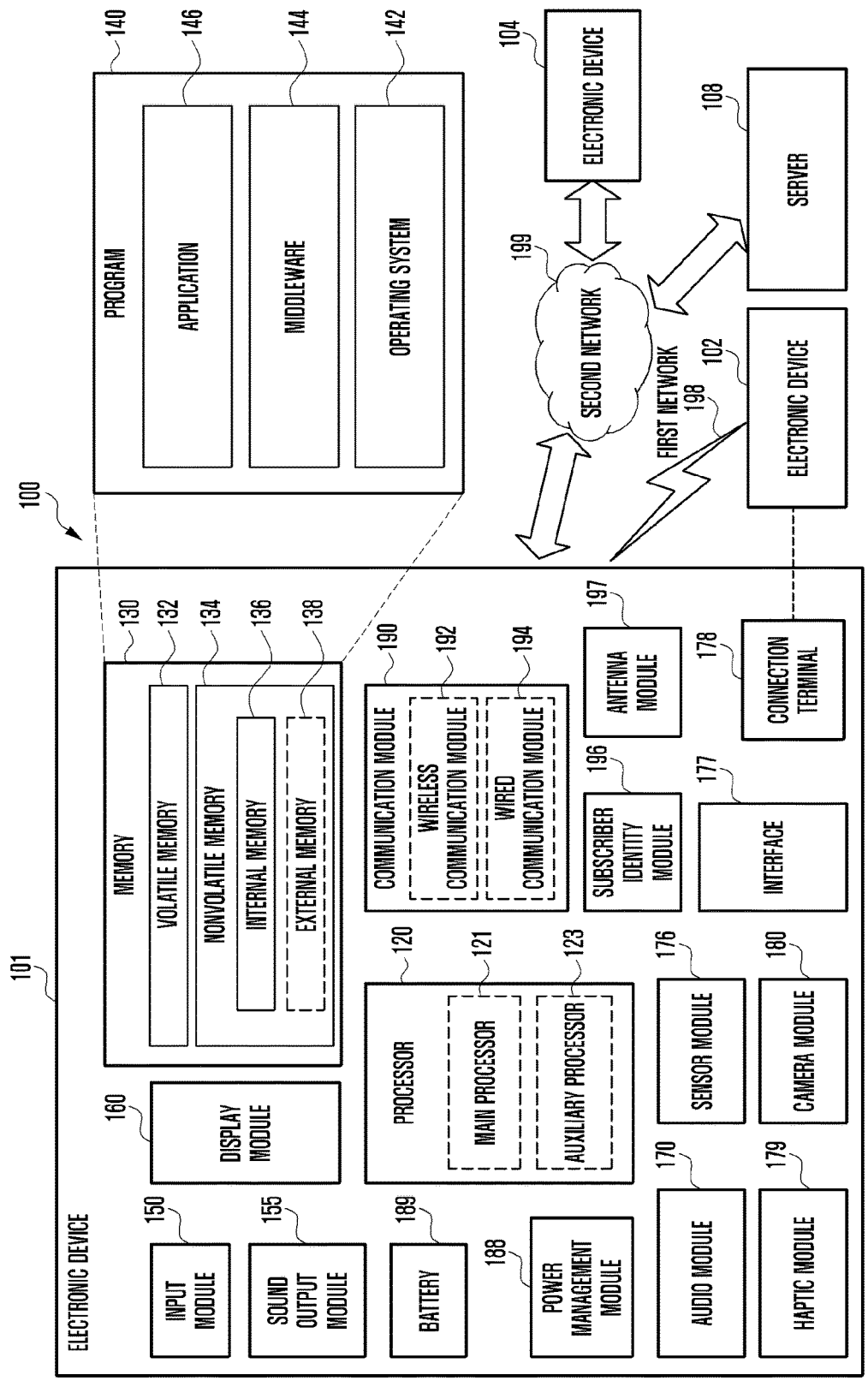
FIG. 1 is a block diagram of an electronic device in a network environment according to various embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connection terminal 178, a haptic module 179, a camera module 180, a power management module 188, a battery 189, a communication module 190, a subscriber identification module (SIM) 196, or an antenna module 197. In some embodiments, at least one of the components (e.g., the connection terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connection terminal 178 may include a connector via which the electronic device 101 may be physically connected with the external electronic device (e.g., the electronic device 102). According to an embodiment, the connection terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
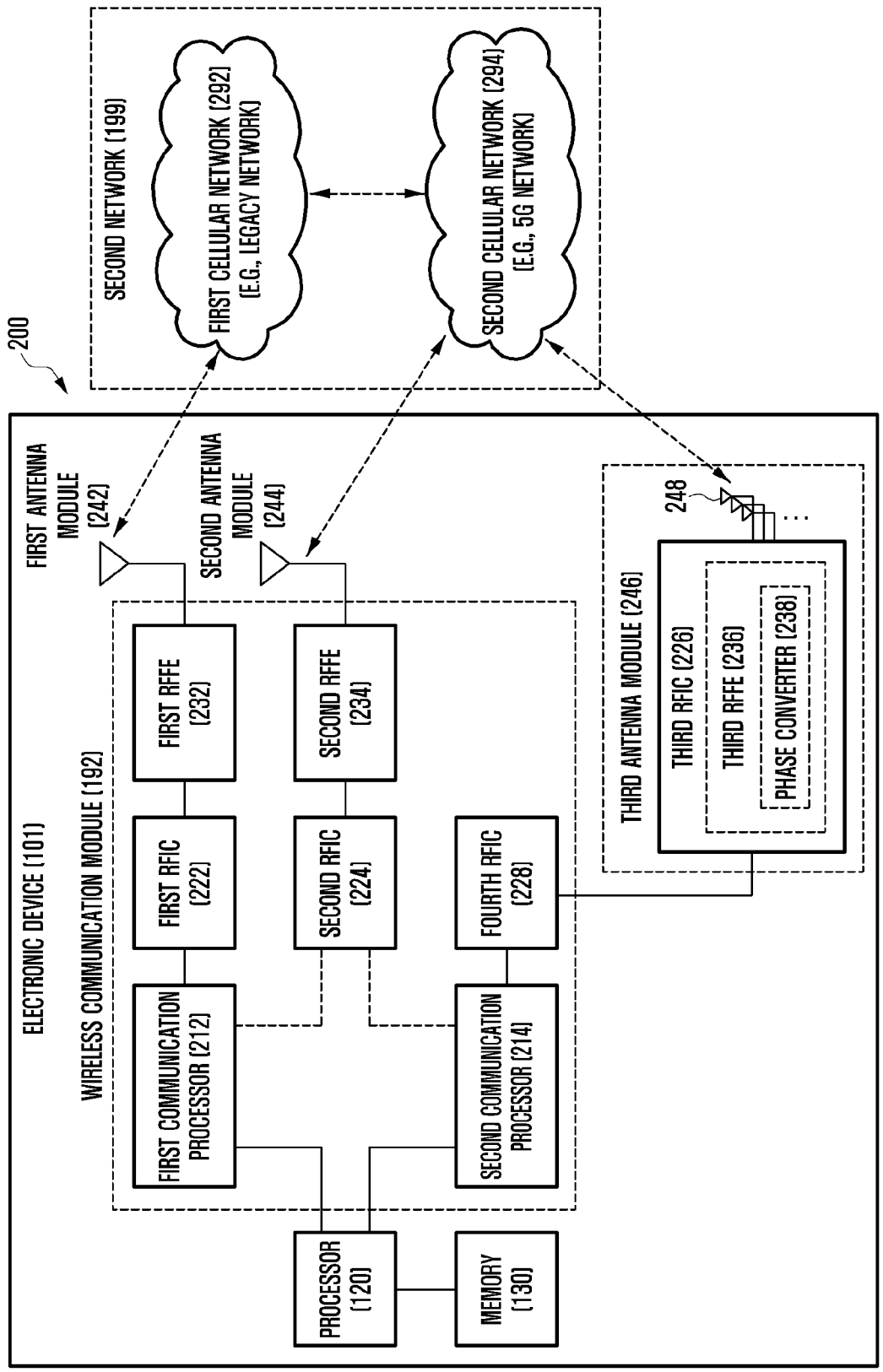
FIG. 2 is a block diagram of the electronic device for supporting legacy network communication and 5G network communication according to various embodiments.

FIG. 2 is a block diagram illustrating an electronic device in a network environment 200 including a plurality of cellular networks according to various embodiments of the disclosure.

Referring to FIG. 2, the electronic device 101 may include a first communication processor 212, second communication processor 214, first RFIC 222, second RFIC 224, third RFIC 226, fourth RFIC 228, first radio frequency front end (RFFE) 232, second RFFE 234, first antenna module 242, second antenna module 244, and antenna 248. The electronic device 101 may include a processor 120 and a memory 130. A second network 199 may include a first cellular network 292 and a second cellular network 294. According to another embodiment, the electronic device 101 may further include at least one of the components described with reference to FIG. 1, and the second network 199 may further include at least one other network. According to one embodiment, the first communication processor 212, second communication processor 214, first RFIC 222, second RFIC 224, fourth RFIC 228, first RFFE 232, and second RFFE 234 may form at least part of the wireless communication module 192. According to another embodiment, the fourth RFIC 228 may be omitted or included as part of the third RFIC 226.

The first communication processor 212 may establish a communication channel of a band to be used for wireless communication with the first cellular network 292 and support legacy network communication through the established communication channel. According to various embodiments, the first cellular network may be a legacy network including a second generation (2G), 3G, 4G, or long term evolution (LTE) network. The second communication processor 214 may establish a communication channel corresponding to a designated band (e.g., about 6 GHz to about 60 GHz) of bands to be used for wireless communication with the second cellular network 294, and support 5G network communication through the established communication channel. According to various embodiments, the second cellular network 294 may be a 5G network defined in 3GPP. Additionally, according to an embodiment, the first communication processor 212 or the second communication processor 214 may establish a communication channel corresponding to another designated band (e.g., about 6 GHz or less) of bands to be used for wireless communication with the second cellular network 294 and support 5G network communication through the established communication channel. According to one embodiment, the first communication processor 212 and the second communication processor 214 may be implemented in a single chip or a single package. According to various embodiments, the first communication processor 212 or the second communication processor 214 may be formed in a single chip or a single package with the processor 120, the auxiliary processor 123, or the communication module 190.

Upon transmission, the first RFIC 222 may convert a baseband signal generated by the first communication processor 212 to a radio frequency (RF) signal of about 700 MHz to about 3 GHz used in the first cellular network 292 (e.g., legacy network). Upon reception, an RF signal may be obtained from the first cellular network 292 (e.g., legacy network) through an antenna (e.g., the first antenna module 242) and be preprocessed through an RFFE (e.g., the first RFFE 232). The first RFIC 222 may convert the preprocessed RF signal to a baseband signal so as to be processed by the first communication processor 212.

Upon transmission, the second RFIC 224 may convert a baseband signal generated by the first communication processor 212 or the second communication processor 214 to an RF signal (hereinafter, 5G Sub6 RF signal) of a Sub6 band (e.g., 6 GHz or less) to be used in the second cellular network 294 (e.g., 5G network). Upon reception, a 5G Sub6 RF signal may be obtained from the second cellular network 294 (e.g., 5G network) through an antenna (e.g., the second antenna module 244) and be pretreated through an RFFE (e.g., the second RFFE 234). The second RFIC 224 may convert the preprocessed 5G Sub6 RF signal to a baseband signal so as to be processed by a corresponding communication processor of the first communication processor 212 or the second communication processor 214.

The third RFIC 226 may convert a baseband signal generated by the second communication processor 214 to an RF signal (hereinafter, 5G Above6 RF signal) of a 5G Above6 band (e.g., about 6 GHz to about 60 GHz) to be used in the second cellular network 294 (e.g., 5G network). Upon reception, a 5G Above6 RF signal may be obtained from the second cellular network 294 (e.g., 5G network) through an antenna (e.g., the antenna 248) and be preprocessed through the third RFFE 236. The third RFIC 226 may convert the preprocessed 5G Above6 RF signal to a baseband signal so as to be processed by the second communication processor 214. According to one embodiment, the third RFFE 236 may be formed as part of the third RFIC 226.

According to an embodiment, the electronic device 101 may include a fourth RFIC 228 separately from the third RFIC 226 or as at least part of the third RFIC 226. In this case, the fourth RFIC 228 may convert a baseband signal generated by the second communication processor 214 to an RF signal (hereinafter, an intermediate frequency (IF) signal) of an intermediate frequency band (e.g., about 9 GHz to about 11 GHz) and transfer the IF signal to the third RFIC 226. The third RFIC 226 may convert the IF signal to a 5G Above 6RF signal. Upon reception, the 5G Above 6RF signal may be received from the second cellular network 294 (e.g., a 5G network) through an antenna (e.g., the antenna 248) and be converted to an IF signal by the third RFIC 226. The fourth RFIC 228 may convert an IF signal to a baseband signal so as to be processed by the second communication processor 214.

According to one embodiment, the first RFIC 222 and the second RFIC 224 may be implemented into at least part of a single package or a single chip. According to one embodiment, the first RFFE 232 and the second RFFE 234 may be implemented into at least part of a single package or a single chip. According to one embodiment, at least one of the first antenna module 242 or the second antenna module 244 may be omitted or may be combined with another antenna module to process RF signals of a corresponding plurality of bands.

According to one embodiment, the third RFIC 226 and the antenna 248 may be disposed at the same substrate to form a third antenna module 246. For example, the wireless communication module 192 or the processor 120 may be disposed at a first substrate (e.g., main PCB). In this case, the third RFIC 226 is disposed in a partial area (e.g., lower surface) of the first substrate and a separate second substrate (e.g., sub PCB), and the antenna 248 is disposed in another partial area (e.g., upper surface) thereof; thus, the third antenna module 246 may be formed. By disposing the third RFIC 226 and the antenna 248 in the same substrate, a length of a transmission line therebetween can be reduced. This may reduce, for example, a loss (e.g., attenuation) of a signal of a high frequency band (e.g., about 6 GHz to about 60 GHz) to be used in 5G network communication by a transmission line. Therefore, the electronic device 101 may improve a quality or speed of communication with the second cellular network 294 (e.g., 5G network).

According to one embodiment, the antenna 248 may be formed in an antenna array including a plurality of antenna elements that may be used for beamforming. In this case, the third RFIC 226 may include a plurality of phase shifters 238 corresponding to a plurality of antenna elements, for example, as part of the third RFFE 236. Upon transmission, each of the plurality of phase shifters 238 may convert a phase of a 5G Above6 RF signal to be transmitted to the outside (e.g., a base station of a 5G network) of the electronic device 101 through a corresponding antenna element. Upon reception, each of the plurality of phase shifters 238 may convert a phase of the 5G Above6 RF signal received from the outside to the same phase or substantially the same phase through a corresponding antenna element. This enables transmission or reception through beamforming between the electronic device 101 and the outside.

The second cellular network 294 (e.g., 5G network) may operate (e.g., stand-alone (SA)) independently of the first cellular network 292 (e.g., legacy network) or may be operated (e.g., non-stand alone (NSA)) in connection with the first cellular network 292. For example, the 5G network may have only an access network (e.g., 5G radio access network (RAN) or a next generation (NG) RAN and have no core network (e.g., next generation core (NGC)). In this case, after accessing to the access network of the 5G network, the electronic device 101 may access to an external network (e.g., Internet) under the control of a core network (e.g., an evolved packed core (EPC)) of the legacy network. Protocol information (e.g., LTE protocol information) for communication with a legacy network or protocol information (e.g., new radio (NR) protocol information) for communication with a 5G network may be stored in the memory 130 to be accessed by other components (e.g., the processor 120, the first communication processor 212, or the second communication processor 214).

Figure 3A:
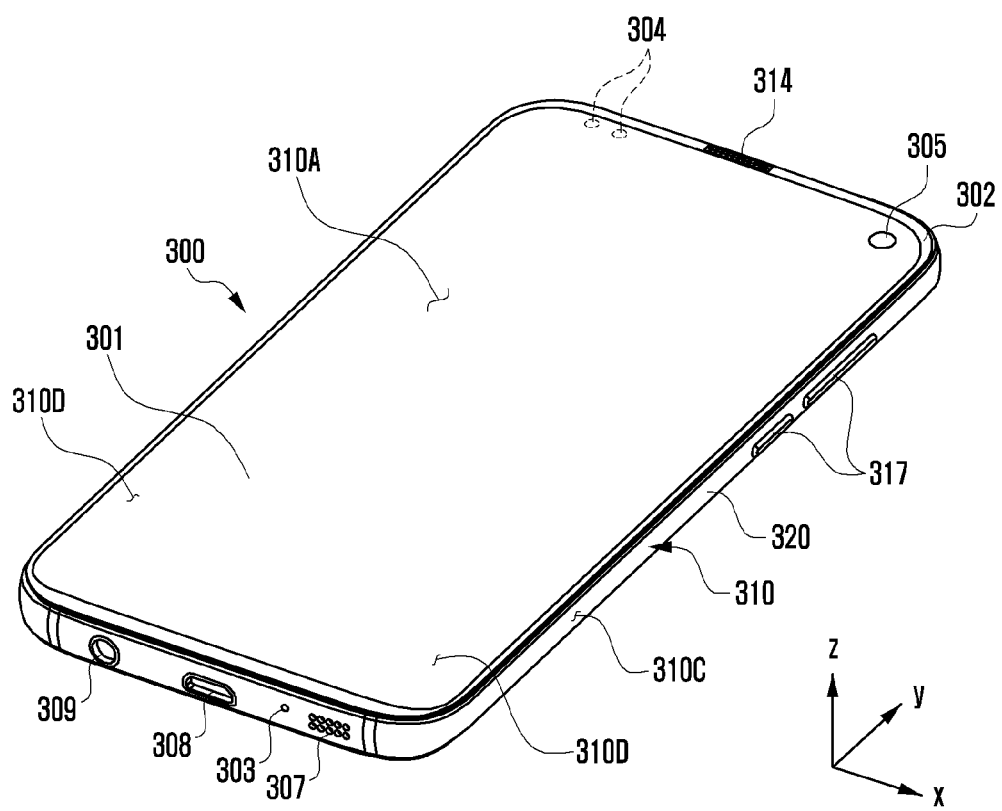
FIG. 3A is a perspective view of a front surface of an electronic apparatus according to various embodiments disclosed in the present document.
Figure 3B:
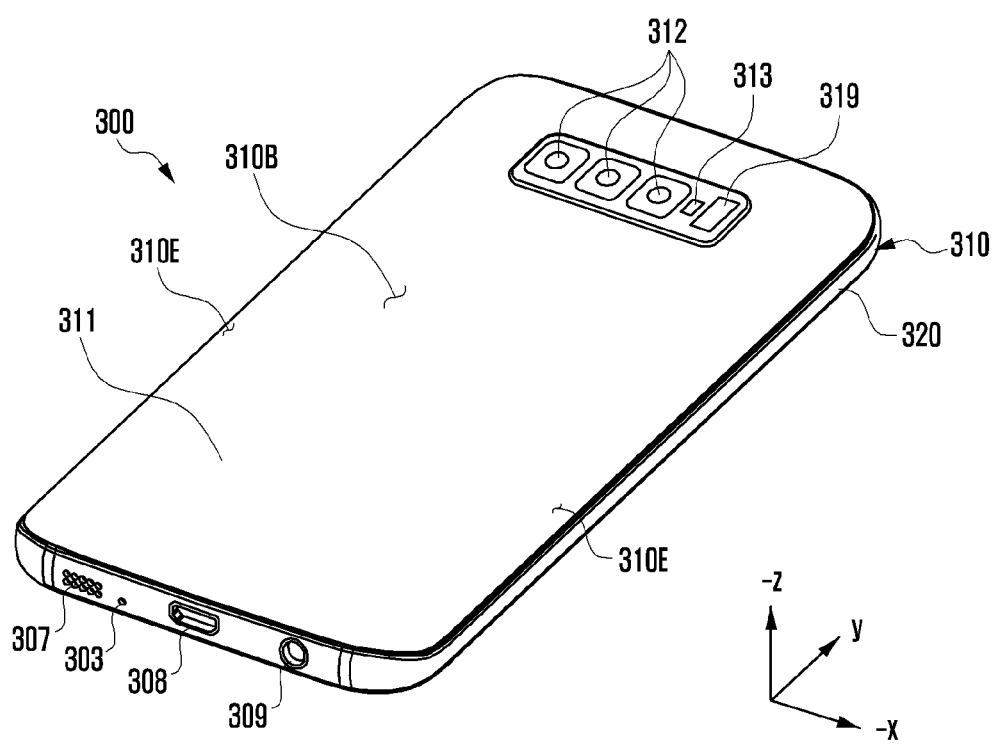
FIG. 3B is a perspective view of a rear surface of the electronic apparatus in FIG. 3A according to various embodiments disclosed in the present document.

FIG. 3A illustrates a perspective view showing a front surface of a mobile electronic device 300 according to an embodiment, and FIG. 3B illustrates a perspective view showing a rear surface of the mobile electronic device 300 shown in FIG. 3A.

The electronic device 300 of FIGS. 3A and 3B may be at least partially similar to the electronic device 101 of FIG. 1 or may include other embodiments of the electronic device.

Referring to FIGS. 3A and 3B, the mobile electronic device 300 may include a housing 310 that includes a first surface (or front surface) 310A, a second surface (or rear surface) 310B, and a lateral surface 310C that surrounds a space between the first surface 310A and the second surface 310B. The housing 310 may refer to a structure that forms a part of the first surface 310A, the second surface 310B, and the lateral surface 310C. The first surface 310A may be formed of a front plate 302 (e.g., a glass plate or polymer plate coated with a variety of coating layers) at least a part of which is substantially transparent. The second surface 310B may be formed of a rear plate 311 which is substantially opaque. The rear plate 311 may be formed of, for example, coated or colored glass, ceramic, polymer, metal (e.g., aluminum, stainless steel (STS), or magnesium), or any combination thereof. The lateral surface 310C may be formed of a lateral bezel structure (or "lateral member") 320 which is combined with the front plate 302 and the rear plate 311 and includes a metal and/or polymer. The rear plate 311 and the lateral bezel structure 320 may be integrally formed and may be of the same material (e.g., a metallic material such as aluminum).

The front plate 302 may include two first regions 310D disposed at long edges thereof, respectively, and bent and extended seamlessly from the first surface 310A toward the rear plate 311. Similarly, the rear plate 311 may include two second regions 310E disposed at long edges thereof, respectively, and bent and extended seamlessly from the second surface 310B toward the front plate 302. The front plate 302 (or the rear plate 311) may include only one of the first regions 310D (or of the second regions 310E). The first regions 310D or the second regions 310E may be omitted in part. When viewed from a lateral side of the mobile electronic device 300, the lateral bezel structure 320 may have a first thickness (or width) on a lateral side where the first region 310D or the second region 310E is not included, and may have a second thickness, being less than the first thickness, on another lateral side where the first region 310D or the second region 310E is included.

The mobile electronic device 300 may include at least one of a display 301, audio modules 303, 307 and 314, sensor modules 304 and 319, camera modules 305, 312 and 313, a key input device 317, a light emitting device, and connector holes 308 and 309. The mobile electronic device 300 may omit at least one (e.g., the key input device 317 or the light emitting device) of the above components, or may further include other components.

The display 301 may be exposed through a substantial portion of the front plate 302, for example. At least a part of the display 301 may be exposed through the front plate 302 that forms the first surface 310A and the first region 310D of the lateral surface 310C. Outlines (i.e., edges and corners) of the display 301 may have substantially the same form as those of the front plate 302. The spacing between the outline of the display 301 and the outline of the front plate 302 may be substantially unchanged in order to enlarge the exposed area of the display 301. A recess or opening may be formed in a portion of a display area of the display 301 to accommodate at least one of the audio module 314, the sensor module 304, the camera module 305, and the light emitting device. At least one of the audio module 314, the sensor module 304, the camera module 305, the fingerprint sensor (not shown), and the light emitting element may be disposed on the back of the display area of the display 301. The display 301 may be combined with, or adjacent to, a touch sensing circuit, a pressure sensor capable of measuring the touch strength (pressure), and/or a digitizer for detecting a stylus pen. At least a part of the sensor modules 304 and 319 and/or at least a part of the key input device 317 may be disposed in the first region 310D and/or the second region 310E.

The audio modules 303, 307 and 314 may correspond to a microphone hole 303 and speaker holes 307 and 314, respectively. The microphone hole 303 may contain a microphone disposed therein for acquiring external sounds and, in a case, contain a plurality of microphones to sense a sound direction. The speaker holes 307 and 314 may be classified into an external speaker hole 307 and a call receiver hole 314. The microphone hole 303 and the speaker holes 307 and 314 may be implemented as a single hole, or a speaker (e.g., a piezo speaker) may be provided without the speaker holes 307 and 314.

The sensor modules 304 and 319 may generate electrical signals or data corresponding to an internal operating state of the mobile electronic device 300 or to an external environmental condition. The sensor modules 304 and 319 may include a first sensor module 304 (e.g., a proximity sensor) and/or a second sensor module (e.g., a fingerprint sensor) disposed on the first surface 310A of the housing 310, and/or a third sensor module 319 (e.g., a heart rate monitor (HRM) sensor) and/or a fourth sensor module (e.g., a fingerprint sensor) disposed on the second surface 310B of the housing 310. The fingerprint sensor may be disposed on the second surface 310B as well as the first surface 310A (e.g., the display 301) of the housing 310. The electronic device 300 may further include at least one of a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 305, 312 and 313 may include a first camera device 305 disposed on the first surface 310A of the electronic device 300, and a second camera device 312 and/or a flash 313 disposed on the second surface 310B. The camera module 305 or the camera module 312 may include one or more lenses, an image sensor, and/or an image signal processor. The flash 313 may include, for example, a light emitting diode or a xenon lamp. Two or more lenses (infrared cameras, wide angle and telephoto lenses) and image sensors may be disposed on one side of the electronic device 300.

The key input device 317 may be disposed on the lateral surface 310C of the housing 310. The mobile electronic device 300 may not include some or all of the key input device 317 described above, and the key input device 317 which is not included may be implemented in another form such as a soft key on the display 301. The key input device 317 may include the sensor module disposed on the second surface 310B of the housing 310.

The light emitting device may be disposed on the first surface 310A of the housing 310. For example, the light emitting device may provide status information of the electronic device 300 in an optical form. The light emitting device may provide a light source associated with the operation of the camera module 305. The light emitting device may include, for example, a light emitting diode (LED), an IR LED, or a xenon lamp.

The connector holes 308 and 309 may include a first connector hole 308 adapted for a connector (e.g., a USB connector) for transmitting and receiving power and/or data to and from an external electronic device, and/or a second connector hole 309 adapted for a connector (e.g., an earphone jack) for transmitting and receiving an audio signal to and from an external electronic device.

Some sensor modules 305 of camera modules 305 and 312, some sensor modules 304 of sensor modules 304 and 319, or an indicator may be arranged to be exposed through a display 301. For example, the camera module 305, the sensor module 304, or the indicator may be arranged in the internal space of an electronic device 300 so as to be brought into contact with an external environment through an opening of the display 301, which is perforated up to a front plate 302. In another embodiment, some sensor modules 304 may be arranged to perform their functions without being visually exposed through the front plate 302 in the internal space of the electronic device. For example, in this case, an area of the display 301 facing the sensor module may not require a perforated opening.

Figure 3C:
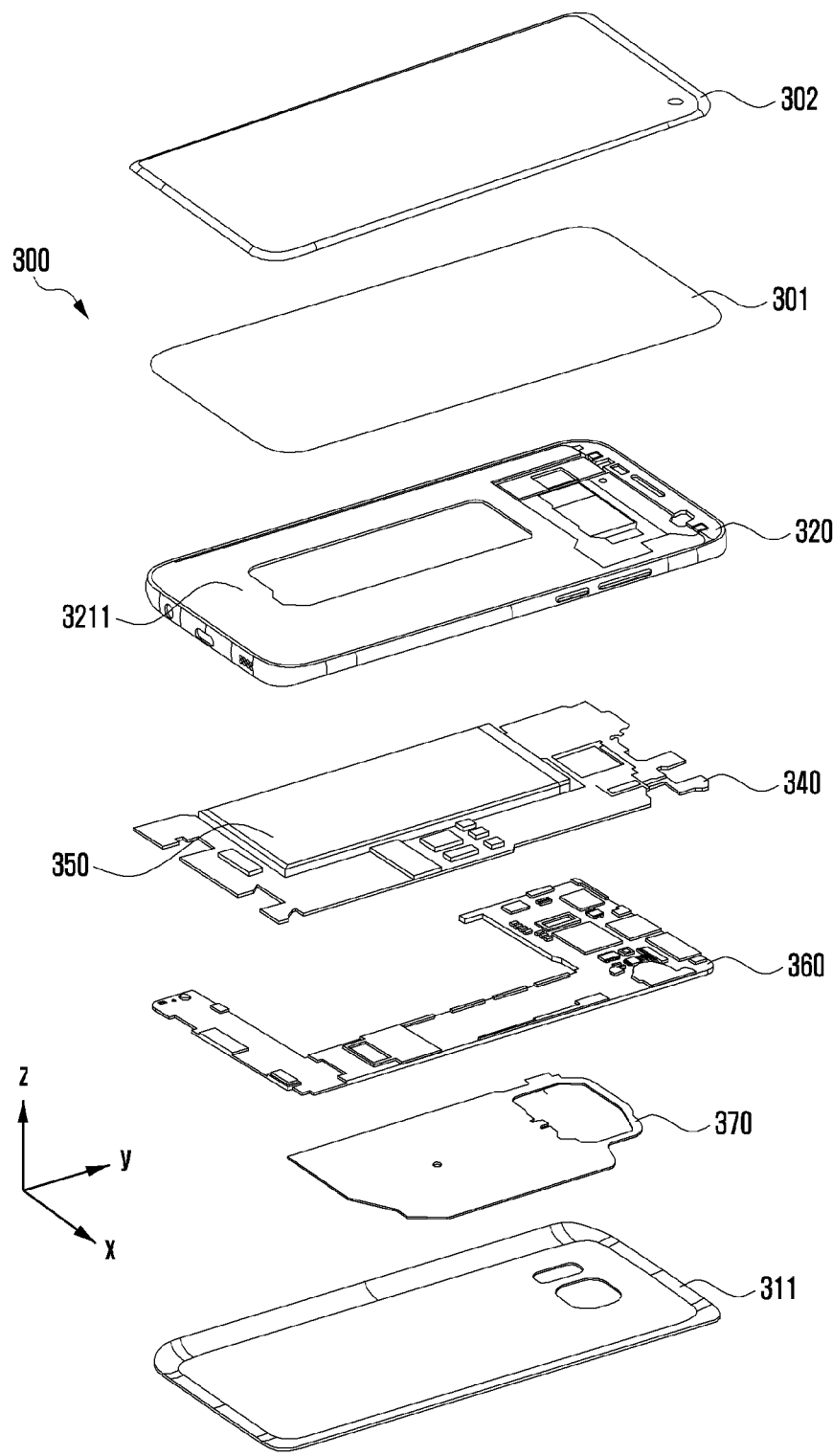
FIG. 3C is a deployed perspective view of the electronic apparatus in FIG. 3A according to various embodiments disclosed in the present document.

FIG. 3C illustrates an exploded perspective view showing a mobile electronic device 300 shown in FIG. 3A.

Referring to FIG. 3C, the mobile electronic device 300 may include a lateral bezel structure 310, a first support member 3211 (e.g., a bracket), a front plate 302, a display 301, an electromagnetic induction panel, a PCB 340, a battery 350, a second support member 360 (e.g., a rear case), an antenna 370, and a rear plate 311. The mobile electronic device 300 may omit at least one (e.g., the first support member 3211 or the second support member 360) of the above components or may further include another component. Some components of the electronic device 300 may be the same as or similar to those of the mobile electronic device 300 shown in FIG. 3A or FIG. 3B, thus, descriptions thereof are omitted below.

The first support member 3211 is disposed inside the mobile electronic device 300 and may be connected to, or integrated with, the lateral bezel structure 310. The first support member 3211 may be formed of, for example, a metallic material and/or a non-metal (e.g., polymer) material. The first support member 3211 may be combined with the display 301 at one side thereof and also combined with the PCB 340 at the other side thereof. On the PCB 340, a processor, a memory, and/or an interface may be mounted. The processor may include, for example, one or more of a CPU, an AP, a GPU, an ISP, a sensor hub processor, or a CP.

The memory may include, for example, volatile memory or non-volatile memory.

The interface may include, for example, a high definition multimedia interface (HDMI), a USB interface, a secure digital (SD) card interface, and/or an audio interface. The interface may electrically or physically connect the mobile electronic device 300 with an external electronic device and may include a USB connector, an SD card/multimedia card (MMC) connector, or an audio connector.

The battery 350 is a device for supplying power to at least one component of the mobile electronic device 300, and may include, for example, a non-rechargeable primary battery, a rechargeable secondary battery, or a fuel cell. At least a part of the battery 350 may be disposed on substantially the same plane as the PCB 340. The battery 350 may be integrally disposed within the mobile electronic device 300, and may be detachably disposed from the mobile electronic device 300.

The antenna 370 may be disposed between the rear plate 311 and the battery 350. The antenna 370 may include, for example, a near field communication (NFC) antenna, a wireless charging antenna, and/or a magnetic secure transmission (MST) antenna. The antenna 370 may perform short-range communication with an external device, or transmit and receive power required for charging wirelessly.

An antenna structure may be formed by a part or combination of the lateral bezel structure 310 and/or the first support member 3211.

Figure 4A:
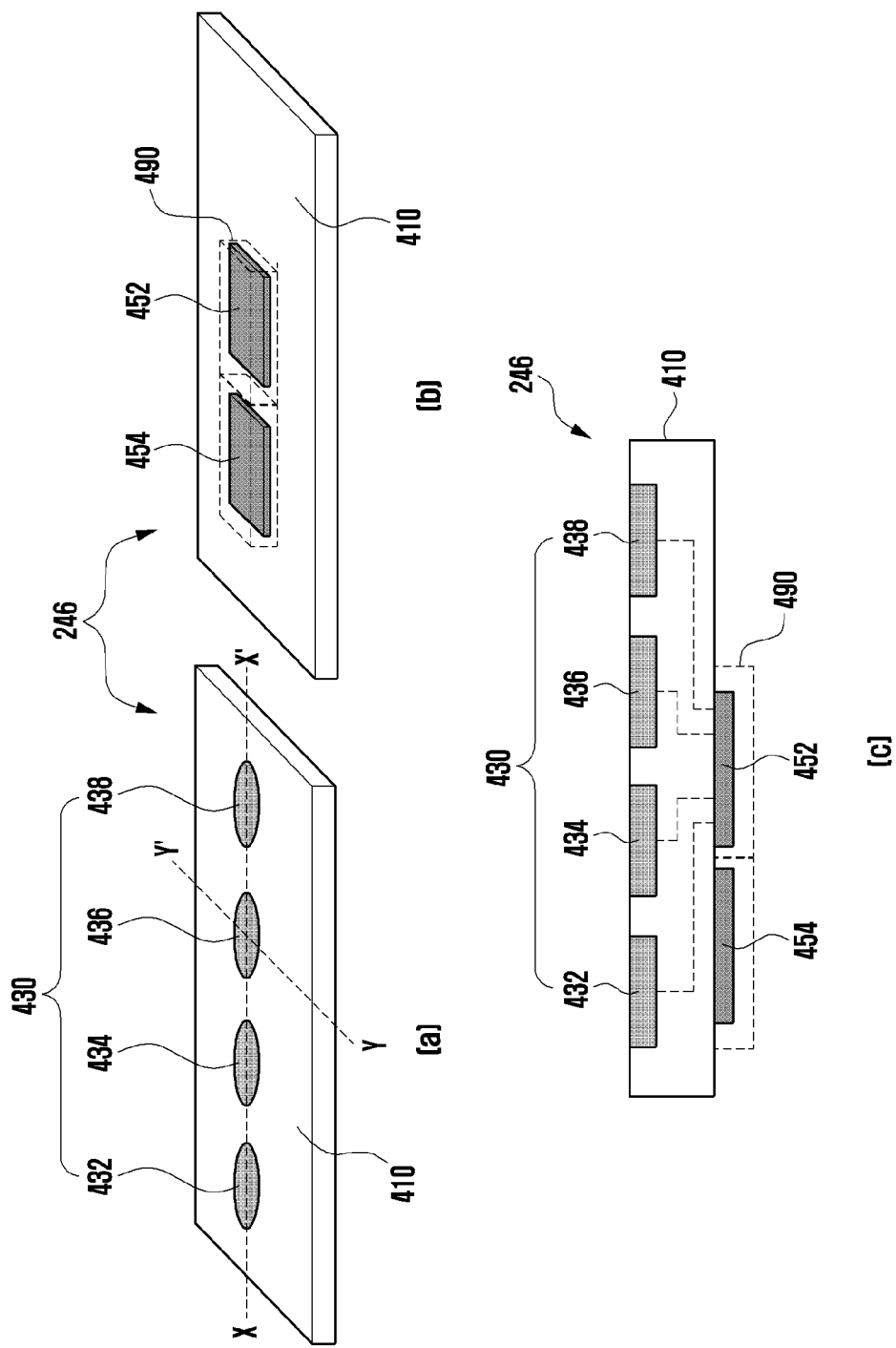
FIG. 4A(a), (b), (c) are views illustrating an embodiment of a structure of a third antenna module 246 illustrated in FIG. 2.

FIG. 4A(a), (b), (c) are views illustrating a structure of, for example, a third antenna module described with reference to FIG. 2 according to various embodiments of the disclosure. FIG. 4A(a) is a perspective view illustrating the third antenna module 246 viewed from one side and FIG. 4A(b) is a perspective view illustrating the third antenna module 246 viewed from the other side. FIG. 4A(c) is a cross-sectional view illustrating the third antenna module 246 taken along line X-X' of FIG. 4A(a).

With reference to FIG. 4A(a), (b), (c), in one embodiment, the third antenna module 246 may include a printed circuit board 410, an antenna array 430, a RFIC 452, and a PMIC 454 (see FIG. 4A(c)). Alternatively, the third antenna module 246 may further include a shield member 490 (see FIG. 4A(c)). In other embodiments, at least one of the above-described components may be omitted or at least two of the components may be integrally formed.

The printed circuit board 410 may include a plurality of conductive layers and a plurality of non-conductive layers stacked alternately with the conductive layers. The printed circuit board 410 may provide electrical connections between the printed circuit board 410 and/or various electronic components disposed outside using wirings and conductive vias formed in the conductive layer.

The antenna array 430 (e.g., 248 of FIG. 2) may include a plurality of antenna elements 432, 434, 436, or 438 disposed to form a directional beam. As illustrated in FIG. 4A(a) and (c), the antenna elements 432, 434, 436, or 438 may be formed at a first surface of the printed circuit board 410. According to another embodiment, the antenna array 430 may be formed inside the printed circuit board 410. According to the embodiment, the antenna array 430 may include the same or a different shape or kind of a plurality of antenna arrays (e.g., dipole antenna array and/or patch antenna array).

As shown in FIG. 4A(b), the RFIC 452 (e.g., the third RFIC 226 of FIG. 2) may be disposed at another area (e.g., a second surface opposite to the first surface) of the printed circuit board 410 spaced apart from the antenna array. The RFIC 452 is configured to process signals of a selected frequency band transmitted/received through the antenna array 430. According to one embodiment, upon transmission, the RFIC 452 may convert a baseband signal obtained from a communication processor (not shown) to an RF signal of a designated band. Upon reception, the RFIC 452 may convert an RF signal received through the antenna array 430 to a baseband signal and transfer the baseband signal to the communication processor.

According to another embodiment, upon transmission, the RFIC 452 may up-convert an IF signal (e.g., about 9 GHz to about 11 GHz) obtained from an intermediate frequency integrate circuit (IFIC) (e.g., 228 of FIG. 2) to an RF signal of a selected band. Upon reception, the RFIC 452 may down-convert the RF signal obtained through the antenna array 430, convert the RF signal to an IF signal, and transfer the IF signal to the IFIC.

The PMIC 454 may be disposed in another partial area (e.g., the second surface) of the printed circuit board 410 spaced apart from the antenna array 430. The PMIC 454 may receive a voltage from a main PCB (not illustrated) to provide power necessary for various components (e.g., the RFIC 452) on the antenna module.

The shielding member 490 may be disposed at a portion (e.g., the second surface) of the printed circuit board 410 so as to electromagnetically shield at least one of the RFIC 452 or the PMIC 454. According to one embodiment, the shield member 490 may include a shield can.

Although not shown, in various embodiments, the third antenna module 246 may be electrically connected to another printed circuit board (e.g., main circuit board) through a module interface. The module interface may include a connecting member, for example, a coaxial cable connector, a board-to-board connector, an interposer, or a flexible printed circuit board (FPCB). The RFIC 452 and/or the PMIC 454 of the antenna module may be electrically connected to the printed circuit board through the connection member.

Figure 4B:
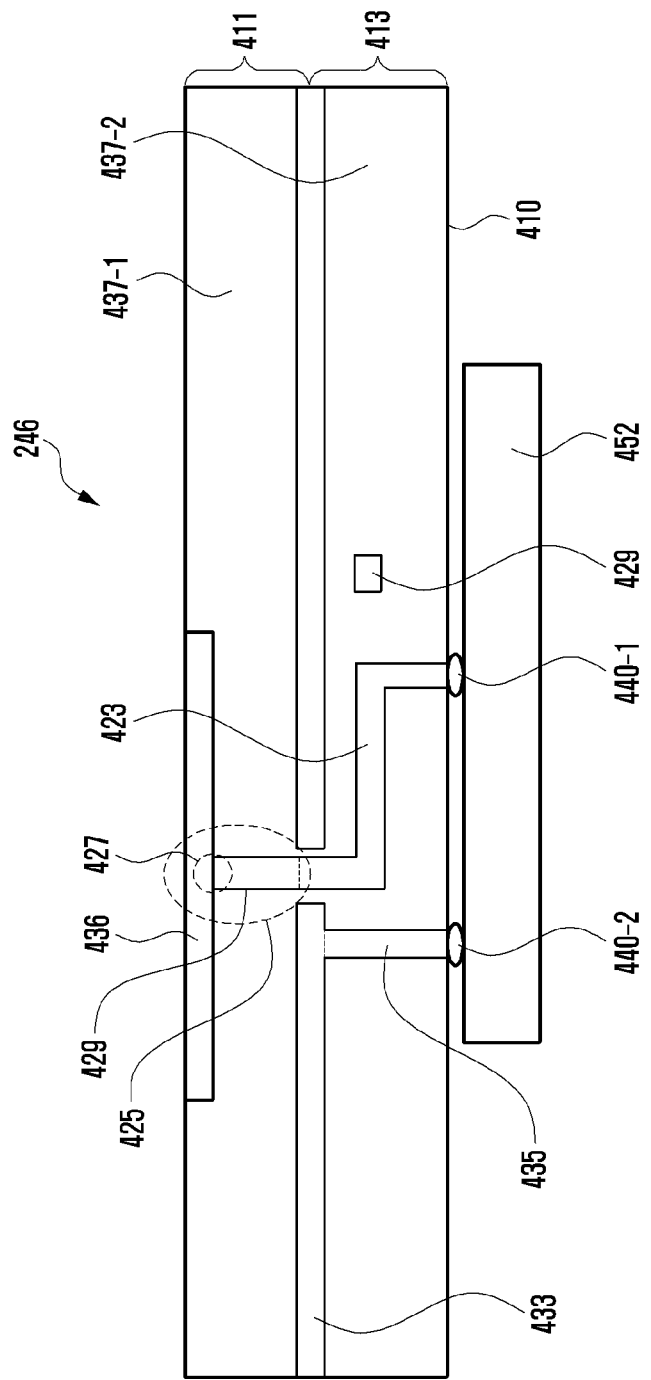
FIG. 4B is a cross-sectional view taken along line Y-Y' of the third antenna module 246 illustrated in FIG. 4A(a).

FIG. 4B is a cross-sectional view illustrating the third antenna module 246 taken along line Y-Y' of FIG. 4A(a) according to various embodiments of the disclosure. The printed circuit board 410 of the illustrated embodiment may include an antenna layer 411 and a network layer 413.

With reference to FIG. 4B, the antenna layer 411 may include at least one dielectric layer 437-1, and an antenna element 436 and/or a power feeding portion 425 formed on or inside an outer surface of a dielectric layer. The power feeding portion 425 may include a power feeding point 427 and/or a power feeding line 429.

The network layer 413 may include at least one dielectric layer 437-2, at least one ground layer 433, at least one conductive via 435, a transmission line 423, and/or a power feeding line 429 formed on or inside an outer surface of the dielectric layer.

Further, in the illustrated embodiment, the RFIC 452 (e.g., the third RFIC 226 of FIG. 2) of FIG. 4A(c) may be electrically connected to the network layer 413 through, for example, first and second solder bumps 440-1 and 440-2. In other embodiments, various connection structures (e.g., solder or a ball grid array (BGA)) instead of the solder bumps may be used. The RFIC 452 may be electrically connected to the antenna element 436 through the first solder bump 440-1, the transmission line 423, and the power feeding portion 425. The RFIC 452 may also be electrically connected to the ground layer 433 through the second solder bump 440-2 and the conductive via 435. Although not illustrated, the RFIC 452 may also be electrically connected to the above-described module interface through the power feeding line 429.

An electronic apparatus, which will be described below, may be an electronic apparatus 300 illustrated in FIGS. 3A to 3C. The electronic apparatus may include at least one of the constituent elements of the electronic apparatus 101 described with reference to FIG. 1.

In the following description, an "electronic apparatus case" may be a lateral bezel structure 320 illustrated in FIGS. 3A and 3B or the lateral member 320 illustrated in FIG. 3C.

In the following description, an "antenna member" may be the third antenna module 246 illustrated in FIGS. 2 and 4A. The term "antenna member" may refer to a constituent element that transmits or receives a communication signal through various communication methods including the communication method described with reference to FIG. 2.

In the following description, the constituent elements identical or similar to the above-mentioned constituent elements will be assigned with the same reference numerals, and a repeated description thereof will be omitted.

Figure 5A:
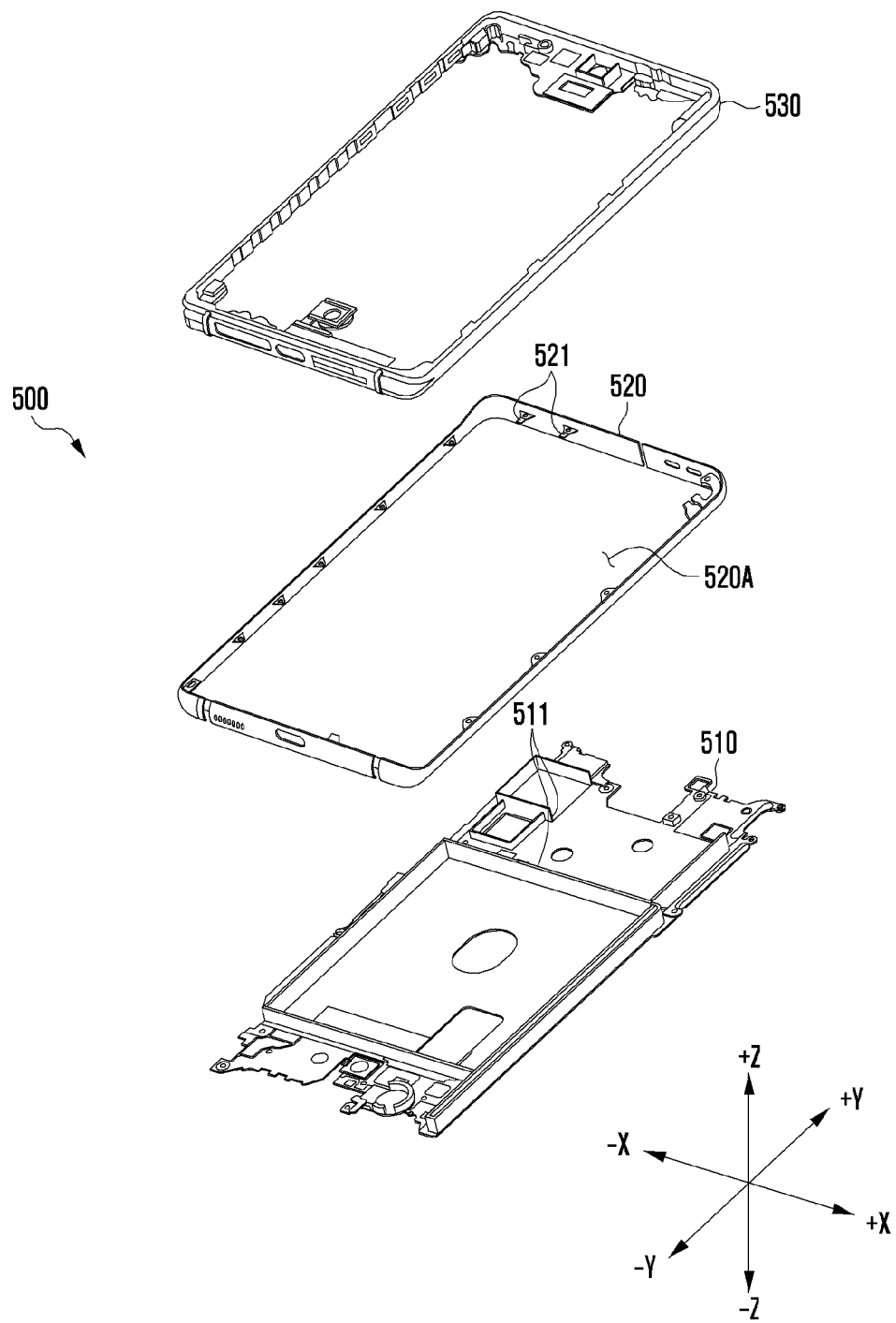
FIG. 5A is an exploded perspective view of an electronic apparatus case according to various embodiments disclosed in the present document.
Figure 5B:
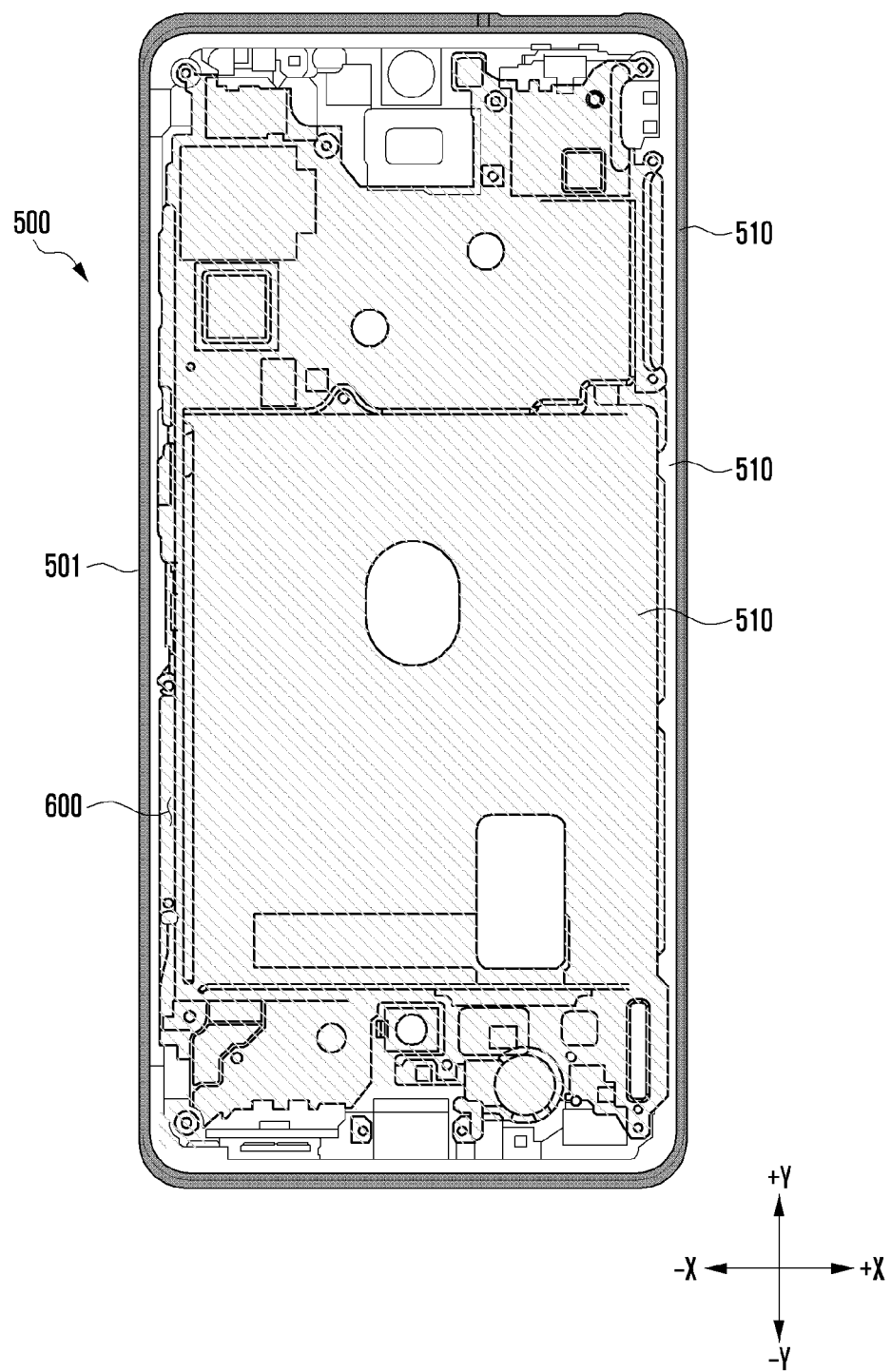
FIG. 5B is a front view of the electronic apparatus case according to various embodiments disclosed in the present document.

FIG. 5A is an exploded perspective view of an electronic apparatus case according to various embodiments disclosed in the present document. FIG. 5B is a front view of the electronic apparatus case according to various embodiments disclosed in the present document.

According to various embodiments, an electronic apparatus case 500 may support various electronic components and/or mechanisms included in the electronic apparatus. A part of the electronic apparatus case 500 may define an external appearance of the electronic apparatus. In the embodiment, the case 500 may include a plate 510, a frame 520, and an intermediate member 530.

According to various embodiments, the plate 510 may include a plurality of concave-convex portions 511. Each one of the pair of concave-convex portions 511 may primarily fix various electronic components and/or mechanisms or define an area in which the electronic component and/or the mechanism is disposed. Therefore, a shape of each one of the concave-convex portions 511 may be variously changed depending on the number, shapes, and arrangements of the electronic components and/or mechanisms disposed in the electronic apparatus.

In the embodiment, the plate 510 may be made of a metallic material. The plate 510 may be formed by various methods. The plate 510 may be made in various ways. For example, the plate 510 may be formed in various ways such as pressing, injection molding, casting including die casting, and cutting (e.g., CNC (computerized numerical control) milling). The above-mentioned forming methods are provided for illustrative purposes only. The plate 510 may be formed by various forming methods within a range that may be understood by those skilled in the art. In the embodiment, the plate 510 may be formed by casting such as die casting.

According to various embodiments, the frame 520 may have a shape that surrounds the plate 510. The plate 510 may be disposed in an opening 520A formed in the frame 520. In the embodiment, the frame 520 may be made of a metallic material. For example, the frame 520 may be made of a metallic material different from the metallic material of the plate 510 or made of a metallic material identical to the metallic material of the plate 510. The frame 520 may be formed by various metal forming methods. For example, the frame 520 may be formed by processing an extrusion/rolling material through a machining method such as CNC.

In the embodiment, the plate 510 and the frame 520 may be manufactured through different processing methods and coupled to each other through a joining method such as welding. In the embodiment, the plate 510 may be manufactured by performing die casting on an ingot. Because the ingot is relatively lower in material cost than the other material, it is possible to reduce a process unit price by using the ingot. Meanwhile, a material, which has excellent fluidity so that the material may smoothly flow in a mold, may be used to smoothly perform die casting. To improve fluidity of the ingot, it is possible to decrease a proportion of aluminum Al and increase a proportion of silicon Si. In this case, there may occur a problem in that it is difficult to apply an anodizing process to the plate 510. The anodizing process is a process capable of providing luxuriousness to the material. In various embodiments disclosed in the present document, the frame 520 may define an external appearance of the electronic apparatus. The process unit price may be reduced when the frame 520 is manufactured by die casting using an ingot material in which a proportion of aluminum is decreased. However, as described above, there is a problem in that it is difficult to applying the anodizing process. Therefore, in consideration of the anodizing process, the frame 520, which defines an external appearance of the electronic apparatus, may be manufactured through a process different from the process of manufacturing the plate 510. For example, as described above, the frame 520 may be formed by processing an extrusion/rolling material, which has a large aluminum content, through a processing method such as CNC. The anodizing process may be easily applied to the frame 520 made of a material with a large aluminum content. Therefore, it is possible to provide luxuriousness to the frame 520 that defines an external appearance of the electronic apparatus.

With reference to FIG. 5A, protruding portions 521 may be disposed along an inner periphery of the frame 520 and can protrude in a direction toward the inside of the frame 520. A junction protrusion (e.g., a junction protrusion 811 in FIG. 8B) or a junction groove (e.g., a junction groove 812 in FIG. 8B) of a junction part (e.g., a junction part 810 in FIG. 8A) to be described below may be formed on the protruding portion 521. The protruding portion 521 may partially overlap a part of the plate 510 when the plate 510 is viewed in a direction (e.g., a +Z direction in FIG. 5A) toward the front surface of the electronic apparatus.

According to various embodiments, the intermediate member 530 may be positioned between the frame 520 and the plate 510. For example, the intermediate member 530 may be formed when a forming material injected between the frame 520 and the plate 510 is solidified. A melted forming material is injected between the frame 520 and the plate 510 and then solidified, such that the intermediate member 530 may be formed. The frame 520 and the plate 510, which are joined to each other, may be inserted into a mold for forming the intermediate member 530. The intermediate member 530 may be formed by injecting the forming material into the mold in the state in which the frame 520 and the plate 510 are inserted into the mold. The intermediate member 530 may be made of a metallic material or a synthetic resin material.

Figure 6:
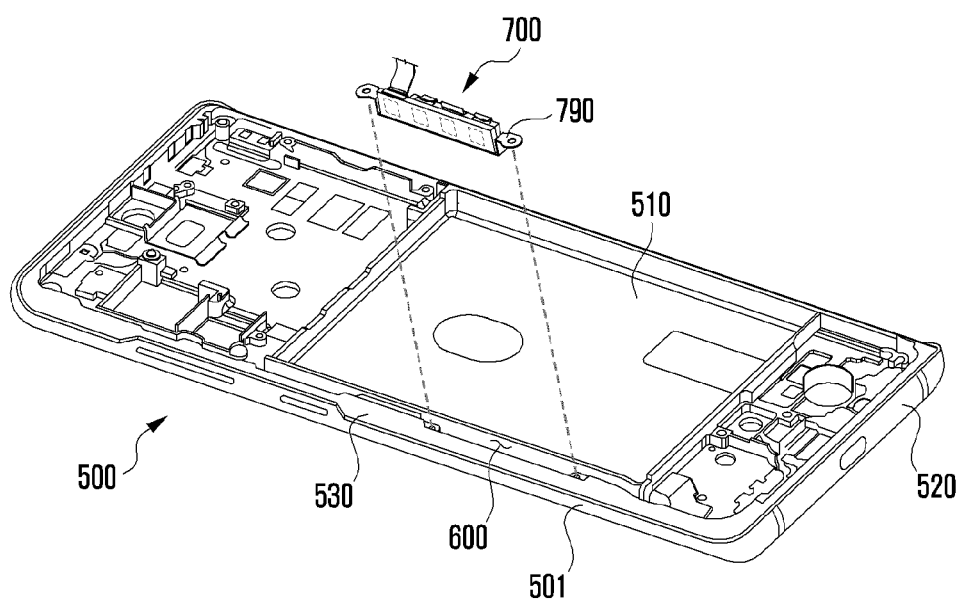
FIG. 6 is a perspective view illustrating an antenna member and the electronic apparatus case according to various embodiments disclosed in the present document.

According to various embodiments, an accommodation space 600 may be provided in a partial area between the frame 520 and the plate 510 and may accommodate an antenna member (e.g., an antenna member 700 in FIG. 6). The accommodation space 600 (see FIG. 6) may be a space defined by being surrounded by the frame 520, the plate 510, and the intermediate member 530. For example, the accommodation space 600 may be formed by partially cutting the frame 520, the plate 510, and the intermediate member 530 or forming a space in which the accommodation space 600 is provided. In addition to the above-mentioned methods, the accommodation space 600 may be formed in various alternative ways. The partial area between the frame 520 and the plate 510 may be considered as a side surface 501 of the electronic apparatus. Therefore, the accommodation space 600 may be understood as a space formed in the side surface 501 of the electronic apparatus. The antenna member may be disposed in the accommodation space 600. The antenna member may radiate a communication signal in the direction (e.g., a –X direction in FIG. 5B) toward the side surface of the electronic apparatus or receive a communication signal in the direction (e.g., the –X direction in FIG. 5B) toward the side surface of the electronic apparatus.

As described above, the accommodation space 600 may mean a space formed when at least one of the frame 520, the plate 510, and the intermediate member 530 is machined or formed in a portion between the frame 520 and the plate 510. In the following description, for convenience of description, the accommodation space 600 is indicated to a portion where the accommodation space 600 is to be formed.

FIG. 6 is a perspective view illustrating the antenna member and the electronic apparatus case according to various embodiments disclosed in the present document.

Figure 7:
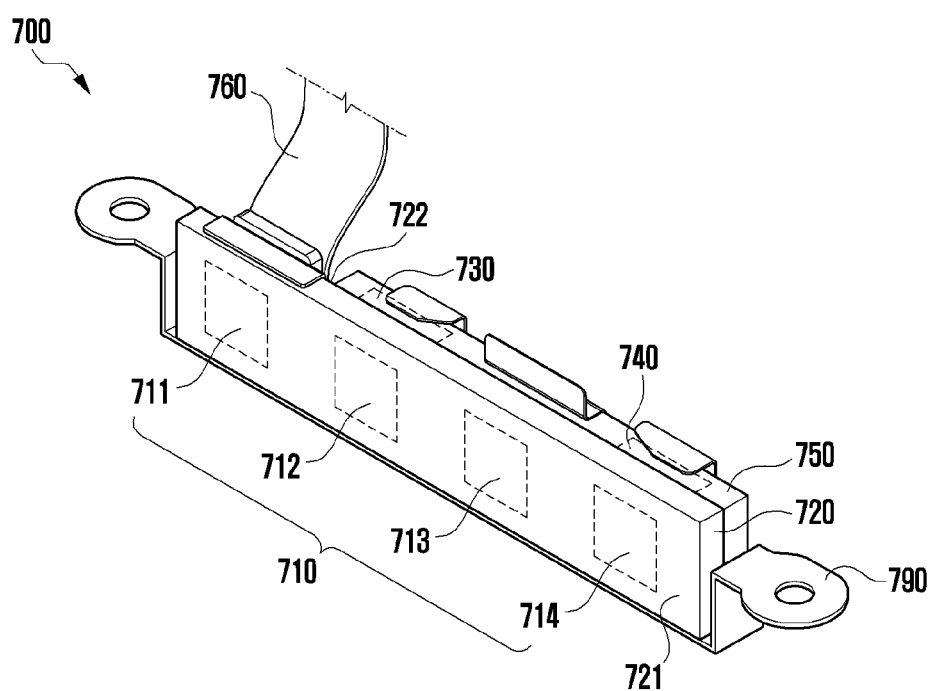
FIG. 7 is a perspective view of the antenna member according to various embodiments disclosed in the present document.

FIG. 7 is a perspective view of the antenna member according to various embodiments disclosed in the present document.

The antenna member 700, which will be described below, may be an antenna similar to the third antenna module 246 described with reference to FIGS. 4A and 4B.

According to various embodiments, the antenna member 700 may include: a substrate 720 (e.g., the printed circuit board 410 in FIG. 4A); a radiation transmission/reception part (hereinafter referred to as "a radiation part") 710 (e.g., the antenna array 430 in FIG. 4A); a radio frequency integrated circuit (RFIC) 730 (e.g., the RFIC 452 in FIG. 4A); a power management integrated circuit (PMIC) 740 (e.g., the PMIC 454 in FIG. 4A); and a shield member 750 (e.g., the shield member 490 FIG. 4A). The above-mentioned constituent elements of the antenna member 700 are provided for illustrative purposes only, and the antenna member 700 may not include some of the above-mentioned constituent elements.

According to various embodiments, the radiation part 710 may be disposed on the substrate 720. The radiation part 710 may transmit or receive a communication signal. The radiation part 710 may be provided as a plurality of radiation parts 710 that serves as an antenna array which is arranged on the substrate 720. For example, as illustrated in FIG. 7, the antenna member 700 may include a first radiation part 711, a second radiation part 712, a third radiation part 713, and a fourth radiation part 714. The number of radiation parts 710 is provided for illustrative purposes only, and the number of radiation parts 710 may be three or less or five or more, the radiation parts 710 may be aligned in a linear array or may be arranged in a different type of formation. The radiation part 710 may be disposed on a first surface 721 of the substrate 720 or disposed in the substrate 720. In this case, the first surface 721 of the substrate 720 may be understood as a front surface of the antenna member 700.

In the embodiment, the radiation parts 710 may be provided on the first surface 721 of the substrate 720 and may be disposed at predetermined similar or varied intervals from one another. For example, the radiation parts 710 may be arranged at the same interval from one another in a longitudinal direction (e.g., a Y-axis direction in FIG. 7) of the substrate 720. In another embodiment, the radiation parts 710 may be arranged at different intervals from one another in the longitudinal direction of the substrate 720. FIGS. 6 and 7 illustrate that the plurality of radiation parts 710 has the same area and the same shape. However, as needed, the plurality of radiation parts 710 may have different areas and different shapes.

According to various embodiments, the RFIC 730 may be disposed on the substrate 720. For example, as illustrated in FIG. 7, the RFIC 730 may be disposed on a second surface 722 opposite to the first surface 721 on which the radiation part 710 is disposed. The RFIC 730 may be constituted to process a communication signal transmitted or received through the radiation part 710. For example, the RFIC 730 may be electrically connected to a communication module (e.g., the communication module 180 in FIG. 1) of the electronic apparatus. The RFIC 730 may convert a signal processed by the communication module into a communication signal in a band designated by the radiation part 710 or convert a communication signal received by the radiation part 710 into a communication signal in a designated band and transmits the communication signal to the communication module. In the embodiment, the RFIC 730 may up-convert an intermediate frequency (IF) signal (e.g., about 9 GHz to about 11 GHz) to a communication signal in a designated band during an operation of transmitting the communication signal. The RFIC 730 may down convert a communication signal received through the radiation part 710 into an IF signal during an operation of receiving the communication signal.

According to various embodiments, the PMIC 740 may be disposed on the substrate 720. For example, as illustrated in FIG. 7, the PMIC 740 may be disposed on the second surface 722 opposite to the first surface 721 on which the radiation part 710 is disposed. The PMIC 740 may be electrically coupled to a main substrate (e.g., the printed circuit board 360 in FIG. 3C) of the electronic apparatus. The PMIC 740 may receive power transmitted from the main substrate and provide the respective constituent elements (e.g., the RFIC 730) of the antenna member 700 with power required to operate the antenna member 700.

According to various embodiments, the shield member 750 may be disposed to electromagnetically shield at least one or both of the RFIC 730 and the PMIC 740. For example, as illustrated in FIG. 7, the shield member 750 may be disposed to cover at least one or both of the RFIC 730 and the PMIC 740. The shield member 750 may be made of a material capable of blocking electromagnetic interference (EMI). For example, the shield member 750 may include a shield can made of a metallic material or a film including a dielectric material and a conductor.

According to various embodiments, the antenna member 700 may be electrically connected to the main substrate of the electronic apparatus through the connection member 750. For example, the connection member 750 may include a coaxial cable connector, a board-to-board connector, an interposer, or a flexible printed circuit board (FPCB).

According to various embodiments, an antenna bracket 790 may support the antenna member 700. In the embodiment, the antenna bracket 790, which supports the antenna member 700, is fixed to the accommodation space 600 provided between the frame 520 and the plate 510, such that the antenna member 700 may be seated in the accommodation space 600. In the embodiment, the antenna bracket 790 may be coupled to the plate 510 by bolting.

With reference to FIG. 6, in the embodiment, the antenna bracket 790 may be fixed to the accommodation space 600 while supporting the antenna member 700 so that a side surface (e.g., a surface directed in a +Z direction in FIG. 7 or a surface directed in a −Z direction) of the antenna member 700 may be directed toward the front or rear surface of the electronic apparatus. In this case, the front surface of the electronic apparatus may refer to a surface on which a display module (e.g., the display 301 in FIG. 3C) of the electronic apparatus is disposed. The rear surface of the electronic apparatus may refer to a surface opposite to the front surface. When the side surface of the antenna member 700 is directed toward the rear or front surface of the electronic apparatus in the state in which the antenna member 700 is seated in the accommodation space 600, the front surface (e.g., the surface directed in the −X direction in FIG. 7) of the antenna member 700 may be directed toward the side surface 501 of the electronic apparatus. The front surface of the antenna member 700 may be a surface corresponding to the first surface 721 of the substrate 720. The radiation part 710 may be disposed on the first surface 721 of the substrate 720. The radiation part 710 of the antenna member 700 may be directed toward the side surface 501 of the electronic apparatus.

Figure 8A:
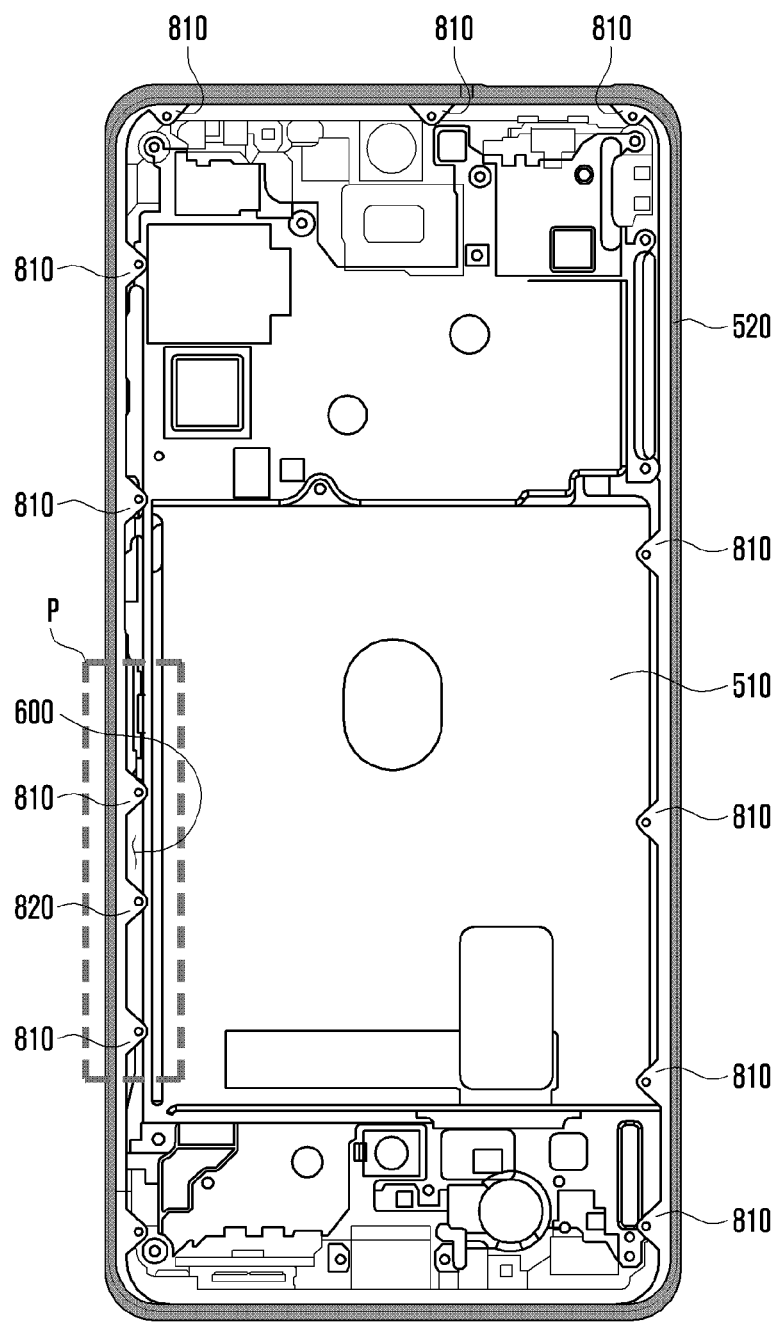
FIG. 8A is a view for explaining coupling between a plate and a frame according to various embodiments disclosed in the present document.
Figure 8B:
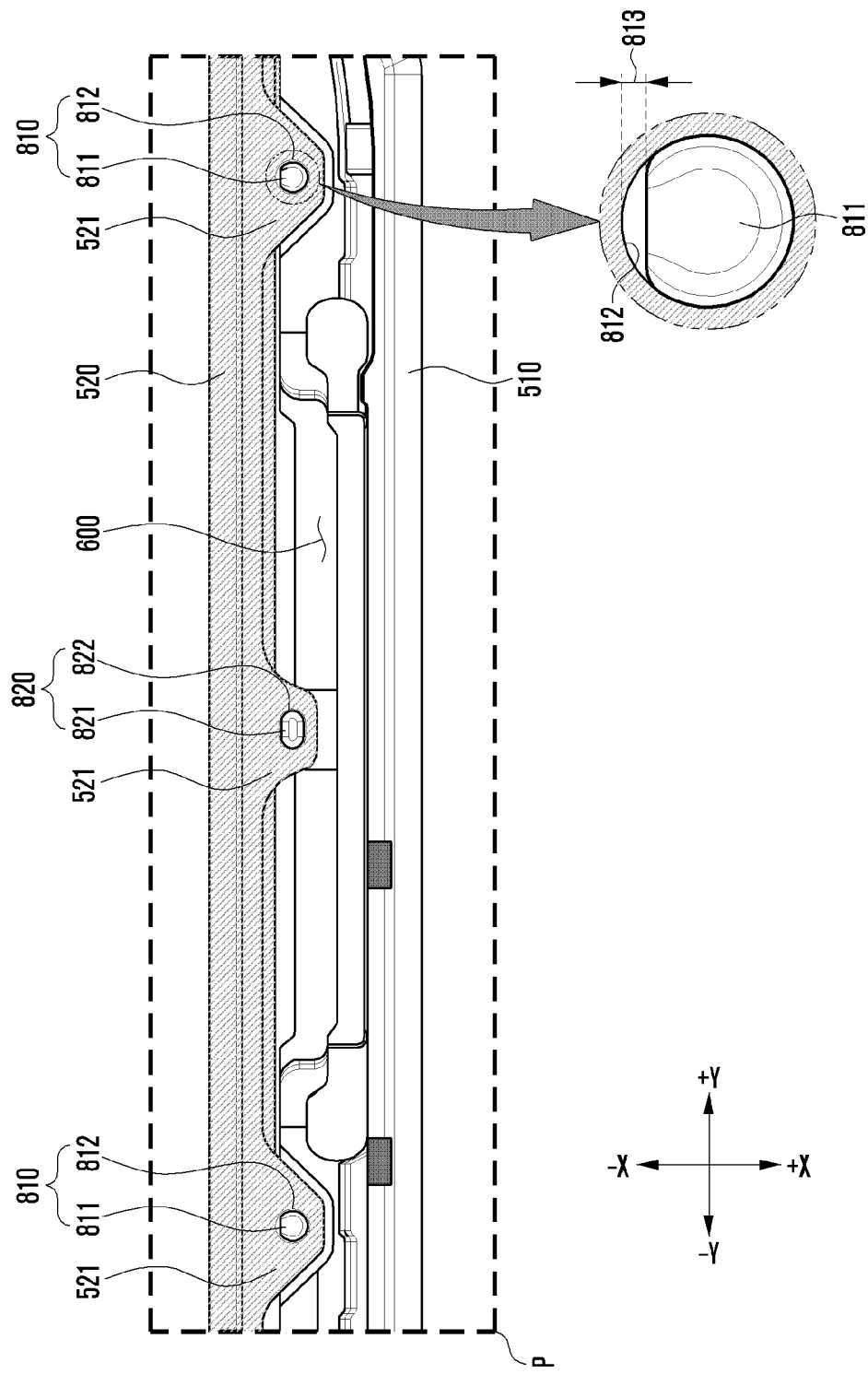
FIG. 8B is an enlarged view of area P illustrated in FIG. 8A.
Figure 9:
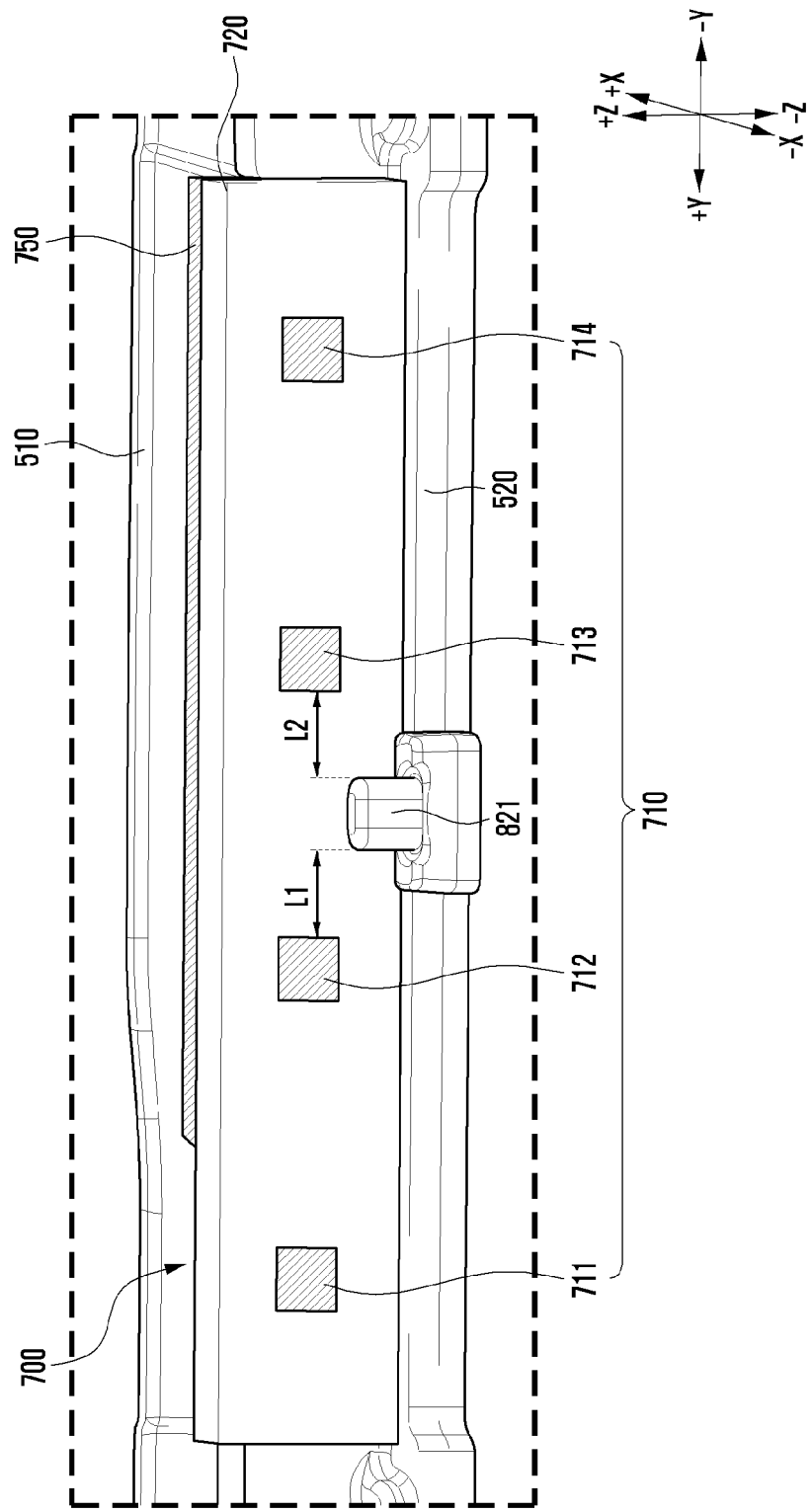
FIG. 9 is a view for explaining a positional relationship between the antenna member and a reinforcement junction part according to various embodiments disclosed in the present document.

FIG. 8A is a view for explaining a coupling between the plate and the frame according to various embodiments disclosed in the present document. FIG. 8B is an enlarged view of area P illustrated in FIG. 8A. FIG. 9 is a view for explaining a positional relationship between the antenna member and a reinforcement junction part according to various embodiments disclosed in the present document.

FIGS. 8A and 8B may be views illustrating the plate 510 and the frame 520 in an intermediate step of a process of manufacturing the electronic apparatus case. This state may be a step before the intermediate member 530 is formed.

According to various embodiments, the junction part 810 may mean a portion where the plate 510 and the frame 520 are coupled. A plurality of junction parts 810 may be present along an outer periphery of the plate 510 and an inner periphery of the junction part 810.

According to various embodiments, the junction part 810 may include a junction protrusion 811 and a junction groove 812. The junction protrusion 811 and the junction groove 812 may be constitutions corresponding to each other. The junction protrusion 811 may be formed to be inserted into the junction groove 812. The junction protrusion 811 may be inserted into the junction groove 812, such that a relative position between the plate 510 and the frame 520 may be determined. The plate 510 and the frame 520 may be joined to each other at a designed position by joining the junction protrusion 811 to the junction groove 812 in the state in which the relative position between the plate 510 and the frame 520 is determined.

In the embodiment, the junction protrusion 811 may be provided as a plurality of junction protrusions 811 provided along the outer periphery of the plate 510, and the junction groove 812 may be provided as a plurality of junction grooves 812 provided along the inner periphery of the frame 520. Although not illustrated in the drawings, because the junction groove 812 and the junction protrusion 811 are constitutions corresponding to each other, the plurality of junction protrusions 811 may be provided along the inner periphery of the frame 520, and the plurality of junction grooves 812 may be provided along the outer periphery of the plate 510 and disposed at positions corresponding to the junction protrusions 811. In some instances, some of the plurality of junction grooves 812 may be formed in the frame 520, and the remaining junction grooves 812 may be formed in the plate 510. In this case, some of the junction protrusions 811 may be formed on the plate 510 and disposed at the positions corresponding to the junction grooves 812, and the remaining junction protrusions 811 may be formed on the frame 520.

With reference to FIG. 8B, the junction groove 812 may be formed in the protruding portion 521 protruding from the frame 520 in the direction (e.g., the +X direction in FIG. 8B) toward the plate 510. According to various embodiments, the junction protrusion 811 and the junction groove 812 may be integrated with the plate 510 and the frame 520, respectively. For example, the junction protrusion 811 may be formed together with the plate 510 during the process of forming the plate 510. The junction groove 812 may be formed together with the frame 520 during the process of forming the frame 520.

According to various embodiments, the junction protrusion 811 is inserted into the junction groove 812, which corresponds in position to the junction protrusion 811, such that the relative position between the frame 520 and the plate 510 may be primarily fixed. The frame 520 and the plate 510 may be coupled to each other by maintaining, by various methods, the state in which the junction protrusion 811 is inserted into the junction groove 812. For example, the junction protrusion 811 may be coupled to the junction groove 812 by a method such as bonding using a bonding agent or welding. In case the junction protrusion 811 is coupled to the junction groove 812 by welding, a surface of the junction protrusion 811 and a surface of the junction groove 812, which adjoin each other, may be welded, or a portion of the junction protrusion 811 and a portion of the junction groove 812, which adjoin each other, may be partially welded by spot welding. The junction protrusion 811 and the junction groove 812 may be joined to each other by various welding methods. For example, welding methods, such as arc welding, gas welding, laser welding, and electron beam welding, may be used. In addition to the above-mentioned welding methods, the junction protrusion 811 and the junction groove 812 may be coupled to each other in various ways.

According to various embodiments, as illustrated in FIG. 8B, in a part of the junction part 810, a diameter of the junction protrusion 811 may be smaller than a diameter of the junction groove 812. A separation space 813 may be formed between the junction protrusion 811 and the junction groove 812 in the state in which the junction protrusion 811 is inserted into the junction groove 812. The plate 510 and the frame 520 may be inserted into the mold in the state in which the plate 510 and the frame 520 are coupled to each other by means of the junction part 810. In this state, the intermediate member 530 may be formed by an injection of the forming material. The forming material may smoothly reach a portion, into which the forming material needs to be injected, while passing through the separation space 813 between the junction protrusion 811 and the junction groove 812.

According to various embodiments, the junction parts 810 may include a reinforcement junction part 820. Like the junction part 810, the reinforcement junction part 820 may include a junction protrusion 821 and a junction groove 822. The reinforcement junction part 820 may be understood as the junction part 810 disposed adjacent to the accommodation space 600 in which the antenna member 700 is disposed. The reinforcement junction part 820 may be disposed between the adjacent radiation parts 710 among the plurality of radiation parts 710 included in the antenna member 700. The reinforcement junction part 820 may be disposed adjacent to the accommodation space 600 and reinforce a coupling force between the plate 510 and the frame 520 at the portion of the accommodation space 600.

For example, in case the junction protrusion 811 and the junction groove 812 are made of a metallic material, it may be difficult for the communication signal to pass through the junction part 810. The junction protrusion 811 and the junction groove 812, which face the radiation part 710 of the antenna member 700, may act as obstacles when the antenna member 700 disposed in the accommodation space 600 receives or transmits the communication signal. In particular, because straightness of the communication signal is high, the influence of the junction protrusion 811 and the junction groove 812 may become greater when the antenna member 700 transmits or receives a high-frequency communication signal (e.g., an mmWave). In case the junction protrusion 811 and the junction groove 812 are not joined to each other at the portion adjacent to the portion where the antenna member 700 is disposed (e.g., the accommodation space 600) to prevent the influence, the portion where the accommodation space 600 is positioned becomes a weak point of the frame 520 and the plate 510, which may cause a decrease in strength of the case 500.

With reference to FIG. 8B, the reinforcement junction part 820 according to various embodiments disclosed in the present document may be positioned at the portion adjacent to the accommodation space 600. The frame 520 and the plate 510 are joined to each other at the portion adjacent to the accommodation space 600 by the reinforcement junction part 820, which makes it possible to solve the above-mentioned problem. Further, the reinforcement junction part 820 is disposed while avoiding the radiation part 710 of the antenna member 700, which makes it possible to reduce an influence on the communication signal transmitted or received through the antenna member 700. As illustrated in FIG. 8B, because the reinforcement junction part 820 is disposed between the radiation parts 710, it is possible to reduce the extent to which the communication signal, which is transmitted from the radiation part 710 or received through the radiation part 710, interferes with the reinforcement junction part 820. For example, in case the reinforcement junction part 820 is made of a metallic material, the reinforcement junction part 820 may act as an obstacle to the transmission or reception of the communication signal. Because the reinforcement junction part 820 is disposed between the radiation parts 710, it is possible to reduce the communication interference caused by the reinforcement junction part 820.

FIG. 9 is a view for explaining a positional relationship between the antenna member 700 and the reinforcement junction part 820 when the case 500 is viewed from the side surface in a state in which the frame 520 is removed. For example, in case the radiation parts 710 include the first radiation part 711, the second radiation part 712, the third radiation part 713, and the fourth radiation part 714, the junction protrusion 821 of the reinforcement junction part 820 may be disposed between the second radiation part 712 and the third radiation part 713, as illustrated in FIGS. 8B and 9. In another embodiment, the reinforcement junction part 820 may be disposed between the first radiation part 711 and the second radiation part 712 or between the third radiation part 713 and the fourth radiation part 714. In this case, the configuration in which the reinforcement junction part 820 is disposed between the radiation parts 710 may mean that the reinforcement junction part 820 is positioned between the radiation parts 710 when the electronic apparatus is viewed from the side surface. In the embodiment, a distance L1 between the junction protrusion 821 of the reinforcement junction part 820 and the second radiation part 712 may be substantially equal to a distance L2 between the junction protrusion 821 and the third radiation part 713.

According to various embodiments, the reinforcement junction part 820 may be disposed between the first radiation part 711 and the second radiation part 712 or disposed between the third radiation part 713 and the fourth radiation part 714. In some instances, the plurality of reinforcement junction parts 820 may be disposed in at least one of the portions between the first radiation part 711 and the second radiation part 712, between the second radiation part 712 and the third radiation part 713, and between the third radiation part 713 and the fourth radiation part 714.

Figure 10A:
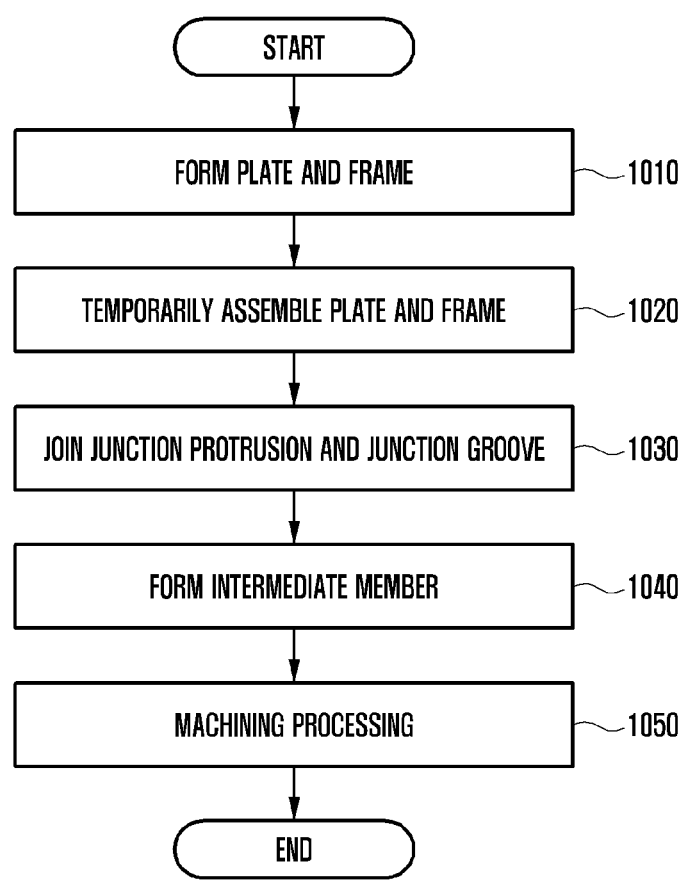
FIG. 10A is a flowchart illustrating a method of manufacturing the electronic apparatus case according to various embodiments disclosed in the present document.
Figure 10B:
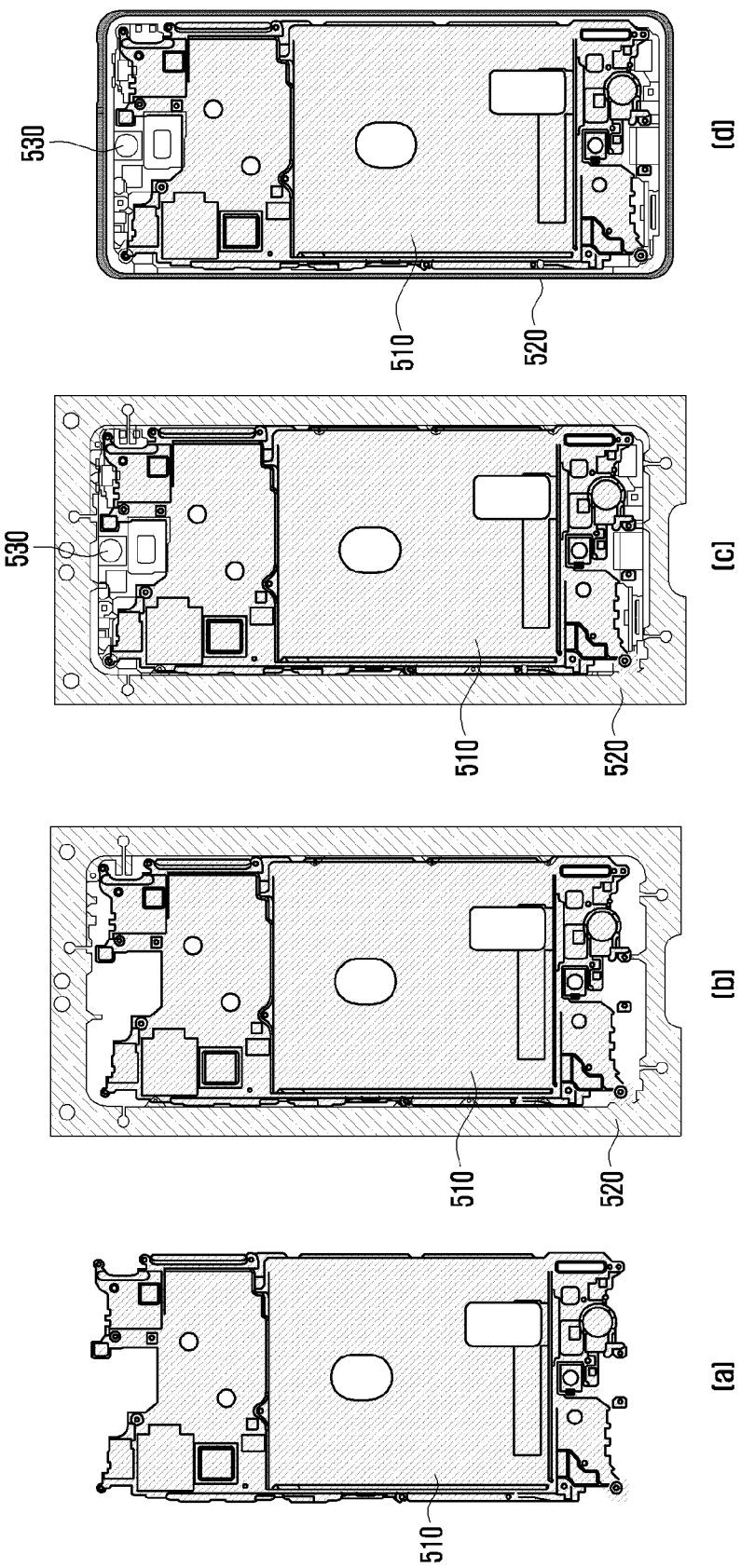
FIG. 10B(a), (b), (c), (d) is a view illustrating a state of an electronic apparatus case manufactured according to various embodiments disclosed in the present document.
Figure 10C:
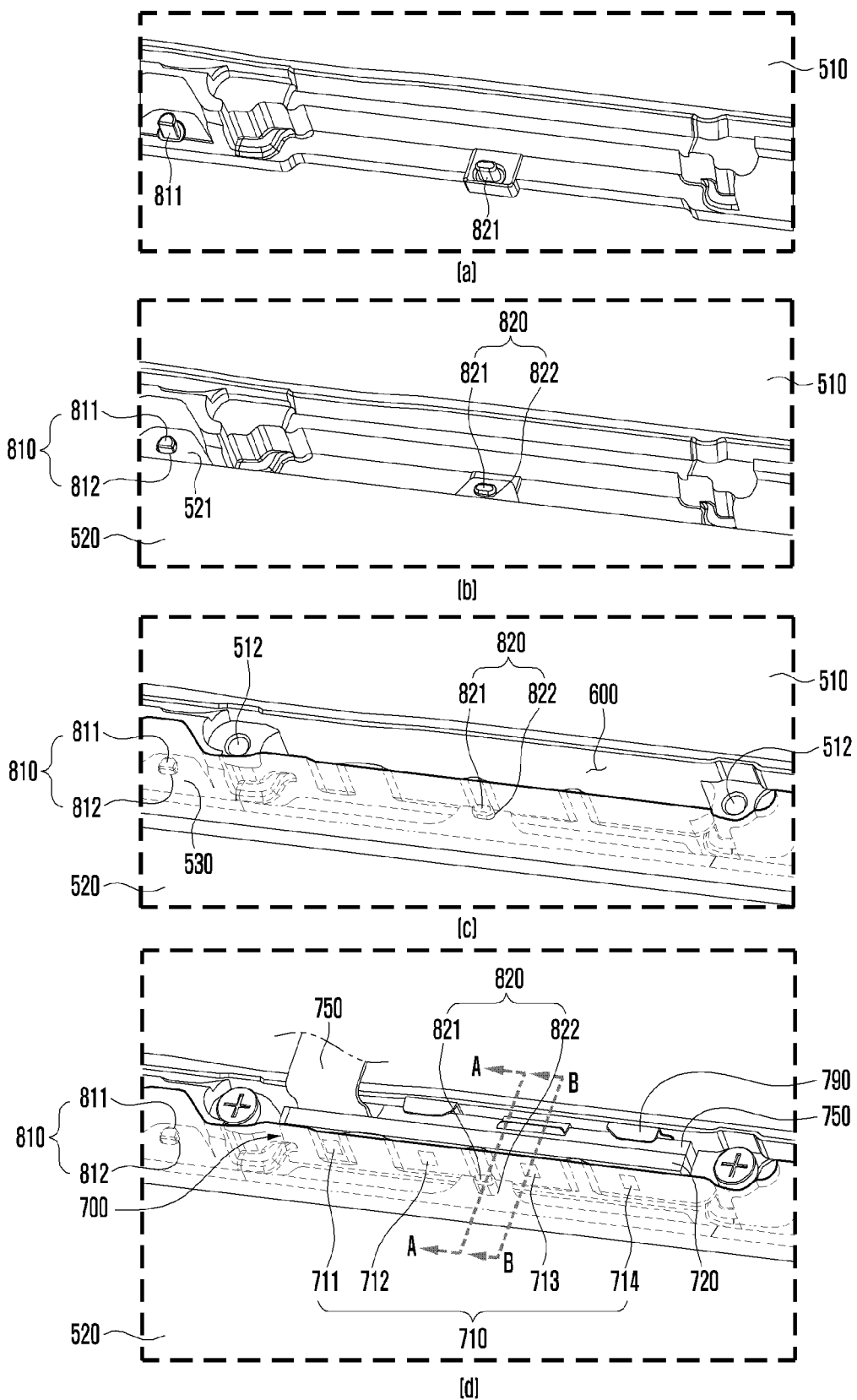
FIG. 10C is a view illustrating states of an accommodation space and a peripheral portion of the electronic apparatus case manufactured according to various embodiments disclosed in the present document.

FIG. 10A is a flowchart illustrating a method of manufacturing the electronic apparatus case according to various embodiments disclosed in the present document. FIG. 10B (a), (b), (c), (d) is a view illustrating a state of the electronic apparatus case manufactured according to various embodiments disclosed in the present document. FIG. 10C is a view illustrating states of the accommodation space and a peripheral portion of the electronic apparatus case manufactured according to various embodiments disclosed in the present document.

According to various embodiments, the electronic apparatus case 500 may be manufactured in accordance with the flowchart illustrated in FIG. 10A. However, the flowchart illustrated in FIG. 10A does not limit the method of or the order of the process of manufacturing the electronic apparatus case 500. The flowchart illustrated in FIG. 10A is provided for illustrative purposes only, and the electronic apparatus case 500 may be manufactured in accordance with various ways and orders within a range that may be understood by those skilled in the art. The method of manufacturing the case 500, which will be described below, is provided to exemplarily explain one of the methods of manufacturing the above-mentioned case 500. The above-mentioned case 500 is not limited by the case 500 according to these methods.

First, the frame 520 and the plate 510 may be formed dependently or independently (1010). For example, the plate 510 and the frame 520 may be formed by various processing methods (e.g., plastic processing or cutting). According to various embodiments, a fixing part 529 capable of fixing the frame 520 to a processing apparatus may be formed during the process of forming the frame 520. For example, as illustrated in FIG. 10B(a), (b), (c), (d), the fixing part 529 may be a portion formed on the outer periphery of the frame 520.

Next, the frame 520 and the plate 510 may be temporarily assembled (1020). In the embodiment, the plate 510 and the frame 520 may be temporarily assembled. FIG. 10B(b) is a view illustrating a state in which the plate 510 and the frame 520 are temporarily assembled. When the frame 520 is fixed to the processing apparatus by the fixing part 529, the plate 510 may be disposed in the frame 520. For example, as illustrated in FIG. 10C(b), the plate 510 and the frame 520 may be temporarily assembled by inserting the junction protrusion 811, which is formed along the outer periphery of the plate 510, into the junction groove 812 formed along the inner periphery of the frame 520.

According to various embodiments, the frame 520 and the plate 510 may be joined and coupled to each other (1030). For example, the junction protrusion 811 inserted into the junction groove 812 may be welded to the junction groove 812. When the junction groove 812 and the junction protrusion 811 are welded, the frame 520 and the plate 510 may be coupled. In the embodiment, a diameter of the junction protrusion 811 may be smaller than a diameter of the junction groove 812. In the state in which the junction protrusion 811 is inserted into the junction groove 812, the separation space may be formed between the junction protrusion 811 and the junction groove 812.

According to various embodiments, the intermediate member 530 may be formed between the frame 520 and the plate 510 (1040). For example, the frame 520 and the plate 510 are inserted into the mold, and the melted forming material may be injected into the mold. The forming material may be injected between the frame 520 and the plate 510. The space between the frame 520 and the plate 510 may be smoothly filled with the melted forming material through the separation space (e.g., the separation space 813 in FIG. 8B) between the junction protrusion 811 and the junction groove 812. The intermediate member 530 may be formed when the forming material is solidified. FIG. 10B(c) is a view illustrating a state in which the intermediate member 530 is formed.

Next, cutting processing may be performed on the frame 520, the plate 510, and the intermediate member 530 (1050). In the cutting processing step, the fixing part 529 for fixing the frame 520 to the processing apparatus may be cut, and the outer surface of the frame 520 may be polished. FIG. 10B(d) is a view of the case 500 on which the cutting processing has been completely performed.

According to various embodiments, the accommodation space 600, in which the antenna member 700 is to be disposed, may be formed by cutting a part of the intermediate member 530 disposed between the frame 520 and the plate 510. For example, as illustrated in FIG. 10C(c), the accommodation space 600 may be formed by cutting processing. In the embodiment, a bolt coupling groove 512 may be formed to fix the antenna bracket 790, which supports the antenna member 700, to the accommodation space 600. In this case, as illustrated in FIG. 10C(d), the antenna bracket 790 may be coupled to the plate 510 by bolting by means of the bolt coupling groove 512.

According to various embodiments, the plurality of radiation parts 710 of the antenna member 700, which is seated in the accommodation space 600, may be disposed so as not to overlap the reinforcement junction part 820 disposed adjacent to the accommodation space 600 when the case 500 is viewed from the side surface. The reinforcement junction part 820 may be disposed between the adjacent radiation parts. For example, as illustrated in FIG. 10C(d), the reinforcement junction part 820 may be disposed between the second radiation part 712 and the third radiation part 713 that are disposed adjacent to each other. The reinforcement junction part 820 may reinforce the coupling force between the plate 510 and the frame 520 at the portion of the accommodation space 600. In addition, the reinforcement junction part 820 may be disposed between the radiation parts 710 and reduce interference with the communication signal transmitted or received through the radiation part 710.

Figure 11:
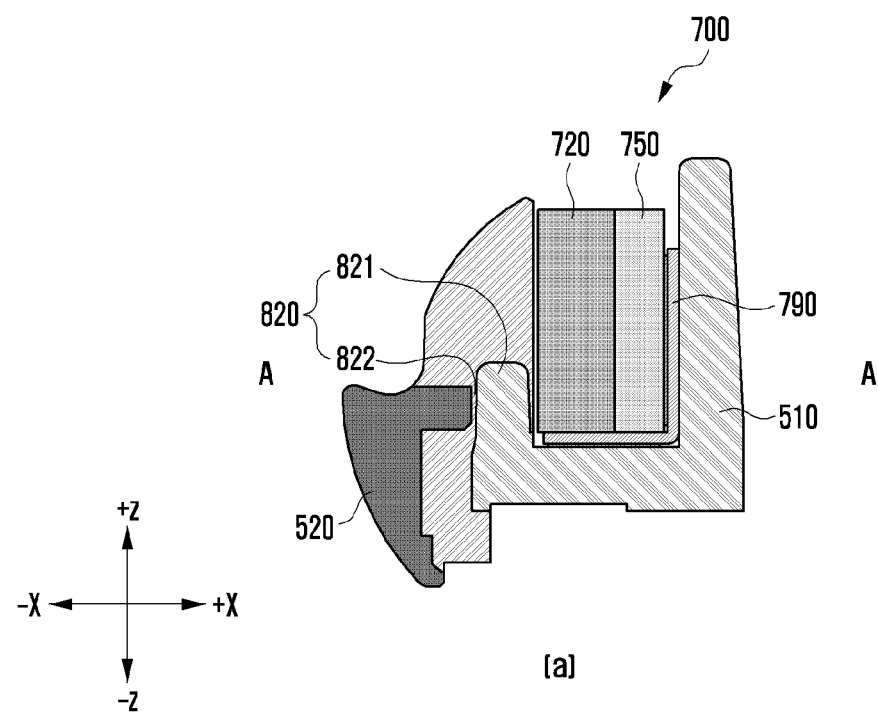
FIG. 11(a), (b) is a cross-sectional view taken by cutting the electronic apparatus case illustrated in FIG. 10C (d).
Figure 11:
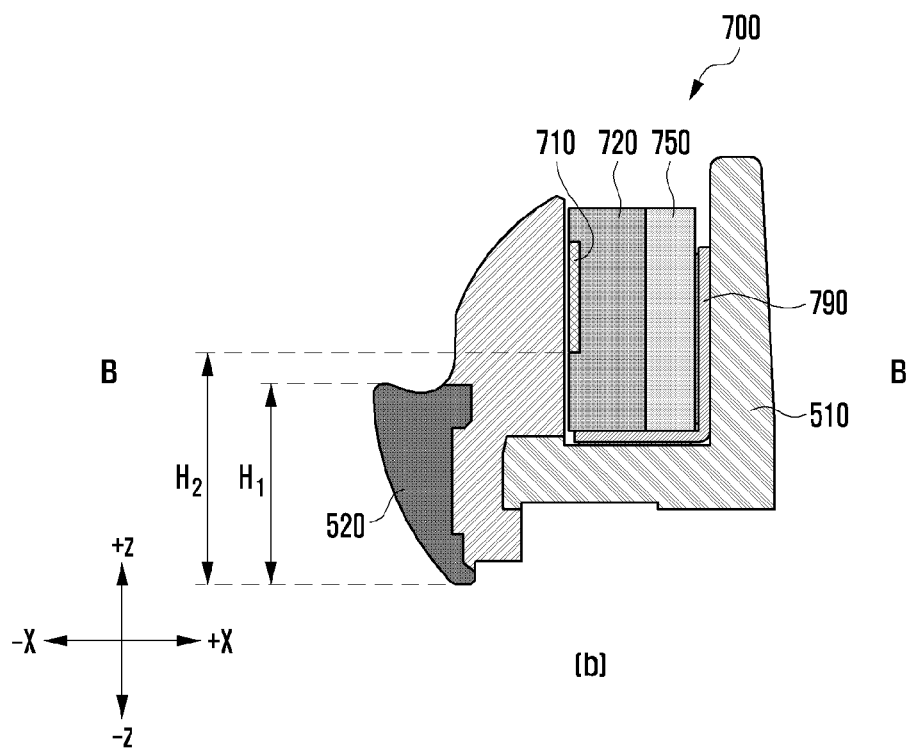

FIG. 11(a), (b) is a cross-sectional view taken by cutting the electronic apparatus case illustrated in FIG. 10C(a), (b), (c), (d). FIG. 11(a) is a cross-sectional view taken along line A-A in FIG. 10C(d), and FIG. 11(b) is a cross-sectional view taken along line B-B in FIG. 10C(d).

According to various embodiments, because the reinforcement junction part 820 is disposed between the radiation parts 710, the radiation part 710 of the antenna member 700 is not illustrated in FIG. 11(a) that is a cross-sectional view taken by cutting the electronic apparatus case to include the reinforcement junction part 820.

With reference to FIG. 11(b), a positional relationship between the frame 520 and the radiation part 710 may be adjusted so that the radiation part 710 of the antenna member 700 disposed in the accommodation space 600 does not face the frame 520. For example, the shape of the frame 520 and the arrangement position of the radiation part 710 may be adjusted so that the frame 520 and the radiation part 710 do not overlap each other when the electronic apparatus is viewed from the side surface. In case the frame 520 is made of a metallic material, the frame 520 may interfere with the communication signal transmitted from or received by the radiation part 710. Therefore, the shape of the frame 520 may be determined so that the frame 520 is not positioned in a radial direction of the radiation part 710.

With reference to FIG. 11(b), a height H1 of the frame 520 may be smaller than a height H2 of the radiation part 710. In this case, the height H1 of the frame 520 may mean a length from the portion adjacent to the accommodation space 600 to the portion maximally protruding from the rear surface of the electronic apparatus. The height of the radiation part 710 may mean a distance by which the radiation part 710 is spaced apart from the rear surface of the electronic apparatus.

The electronic apparatus (e.g., the electronic apparatus 101 in FIG. 1 or the electronic apparatus 300 in FIG. 3A)

according to various embodiments disclosed in the present document may include: the frame (e.g., the frame 520 in FIG. 5A); the plate (e.g., the plate 510 in FIG. 5A) disposed in the frame; the antenna member (e.g., the antenna member 700 in FIG. 7) including the plurality of radiation parts (e.g., the radiation parts 710 in FIG. 7) configured to transmit or receive the RF signal; the accommodation space (e.g., the accommodation space 600 in FIG. 6) provided between the frame and the plate so that the antenna member is disposed between the frame and the plate; and the plurality of junction parts (e.g., the junction parts 810 in FIG. 8A) that is parts by which the frame and the plate are joined. The reinforcement junction part (e.g., the reinforcement junction part 820 in FIG. 8A) included in the plurality of junction parts may be positioned between the adjacent radiation parts among the plurality of radiation parts of the antenna member.

In addition, the electronic apparatus may further include the display module (e.g., the display module 160 in FIG. 1 and the display 301 in FIG. 3C) disposed on the front surface of the electronic apparatus. The antenna member may be disposed in the accommodation space so that the plurality of radiation parts is directed toward the side surface of the electronic apparatus.

In addition, the antenna member may be disposed in the accommodation space so that the first surface of the substrate (e.g., the substrate 720 in FIG. 7) included in the antenna member is directed toward the side surface of the electronic apparatus. The plurality of radiation parts of the antenna member may be provided on the first surface (e.g., the first surface 721 in FIG. 7) of the substrate and disposed at predetermined intervals.

In addition, the antenna member may include: the radio frequency integrated circuit (RFIC) (e.g., the RFIC 730 in FIG. 7) disposed on the second surface (e.g., the second surface 722 in FIG. 7) opposite to the first surface of the substrate and electrically connected to the radiation part; and the shield member (e.g., the shield member 750 in FIG. 7) disposed on the second surface of the substrate and configured to shield the RFIC.

In addition, the plurality of radiation parts of the antenna member may be arranged in the longitudinal direction of the substrate.

In addition, the plurality of radiation parts of the antenna member may include the first radiation part (e.g., the first radiation part 711 in FIG. 7), the second radiation part (e.g., the second radiation part 712 in FIG. 7), the third radiation part (e.g., the third radiation part 713 in FIG. 7), and the fourth radiation part (e.g., the fourth radiation part 714 in FIG. 7). The reinforcement junction part may be positioned between the second radiation part and the third radiation part when the electronic apparatus is viewed from the side surface.

In addition, the distance between the reinforcement junction part and the second radiation part may be substantially equal to the distance between the reinforcement junction part and the third radiation part when the electronic apparatus is viewed from the side surface.

In addition, the frame and the plate may be made of a metallic material, and the plurality of junction parts may be parts where the frame and the plate are coupled to each other by welding.

In addition, at least one of the plurality of junction parts may include: the junction protrusion (e.g., the junction protrusion 811 in FIG. 8B) formed on one of the frame and the plate; and the junction groove (e.g., the junction groove 812 in FIG. 8B) formed in the other of the frame and the plate and provided at a position corresponding to the junction protrusion so that the junction protrusion may be inserted into the junction groove.

In addition, the electronic apparatus may further include the intermediate member (e.g., the intermediate member 530 in FIG. 5A) provided between the frame and the plate.

In addition, the intermediate member may be formed by injecting a forming material between the frame and the plate.

In addition, the diameter of the junction protrusion of at least one of the plurality of junction parts may be smaller than the diameter of the junction groove so that the forming material passes.

The electronic apparatus case (e.g., the case 500 in FIG. 5A) according to various embodiments disclosed in the present document may include: the frame (e.g., the frame 520 in FIG. 5A); the plate (e.g., the plate 510 in FIG. 5A) disposed in the frame; the plurality of junction parts (e.g., the junction part 810 in FIG. 8A) that is parts by which the frame and the plate are joined; and the intermediate member (e.g., the intermediate member 530 in FIG. 5A) formed between the frame and the plate. The reinforcement junction part (e.g., the reinforcement junction part 820 in FIG. 8A) included in the plurality of junction parts may be positioned between the adjacent radiation parts among the plurality of radiation parts (e.g., the radiation parts 710 in FIG. 7) included in the antenna member (e.g., the antenna member 700 in FIG. 7) disposed in the accommodation space (e.g., the accommodation space 600 in FIG. 6) provided between the frame and the plate.

In addition, at least one of the plurality of junction parts may include: the junction protrusion (e.g., the junction protrusion 811 in FIG. 8B) formed on one of the frame and the plate; and the junction groove (e.g., the junction groove 812 in FIG. 8B) formed in the other of the frame and the plate and provided at a position corresponding to the junction protrusion so that the junction protrusion may be inserted into the junction groove.

In addition, the frame and the plate may be made of a metallic material, and the plurality of junction parts may be parts where the frame and the plate are coupled to each other by welding.

In addition, the reinforcement junction part may be positioned between the adjacent radiation parts among the plurality of radiation parts included in the antenna member when the electronic apparatus case is viewed from the side surface.

The method of manufacturing the electronic apparatus case (e.g., the case 500 in FIG. 5A) according to various embodiments disclosed in the present document may include: forming the plate (e.g., the plate 510 in FIG. 5A) and the frame (e.g., the frame 520 in FIG. 5A) (e.g., 1010 in FIG. 10A); temporarily assembling the frame to the plate so that the junction protrusion (e.g., the junction protrusion 811 in FIG. 8B) formed on one of the frame and the plate is inserted into the junction groove (e.g., the junction groove 812 in FIG. 8B) formed on the other of the frame and the plate (e.g., 1020 in FIG. 10A); joining the junction protrusion and the junction groove (e.g., 1030 in FIG. 10A); forming the intermediate member (e.g., the intermediate member 530 in FIG. 5A) in the space between the frame and the plate (e.g., 1040 in FIG. 10A); and cutting at least one of the frame, the plate, and the intermediate member (e.g., 1050 in FIG. 10A). The cutting of the at least one of the frame, the plate, and the intermediate member may include forming the accommodation space (e.g., the accommodation space 600 in FIG. 6) in which the antenna member (e.g., the antenna member 700 in FIG. 7) is disposed between the frame and the plate. The reinforcement junction protrusion (e.g., the junction protrusion 821 in FIG. 8B) included in the junction protrusion and the reinforcement junction groove (e.g., the junction protrusion 822 in FIG. 8B) included in the junction groove may be positioned between the adjacent radiation parts among the plurality of radiation parts (e.g., the radiation parts 710 in FIG. 7) included in the antenna member disposed in the accommodation space.

In addition, the reinforcement junction protrusion and the reinforcement junction groove may be positioned between the adjacent radiation parts among the plurality of radiation parts included in the antenna member when the case is viewed from the side surface.

In addition, the junction protrusion and the junction groove may be joined by welding.

In addition, the forming of the intermediate member may include forming the intermediate member by injection molding by inserting the plate and the frame into the mold and injecting a forming material into the mold.

Further, the embodiments disclosed in the present document disclosed in the present specification and illustrated in the drawings are provided as particular examples for easily explaining the technical contents according to the embodiment disclosed in the present document and helping understand the embodiment disclosed in the present document, but not intended to limit the scope of the embodiment disclosed in the present document. Accordingly, the scope of the various embodiments disclosed in the present document should be interpreted as including all alterations or modifications derived from the technical spirit of the various embodiments disclosed in the present document in addition to the embodiments disclosed herein.

The invention claimed is:

1. An electronic apparatus comprising:
   a frame;
   a plate disposed in the frame;
   an antenna member disposed in an accommodation space provided between the frame and the plate, the antenna member comprising a plurality of radiation parts configured to transmit or receive an RF signal; and
   a plurality of junction parts by which the frame and the plate are joined, the plurality of junction parts comprising a reinforcement junction part positioned between the plurality of radiation parts,
   wherein the reinforcement junction part comprises:
   a reinforcement junction protrusion formed on one of the frame and the plate; and
   a reinforcement junction groove formed in the other of the frame and the plate and provided at a position corresponding to the reinforcement junction protrusion so that the reinforcement junction protrusion is inserted into the reinforcement junction groove.

2. The electronic apparatus of claim 1, further comprising:
   a display module disposed on a front surface of the electronic apparatus,
   wherein the antenna member is disposed in the accommodation space so that the plurality of radiation parts is directed toward a side surface of the electronic apparatus.

3. The electronic apparatus of claim 1, wherein the antenna member is disposed in the accommodation space so that a first surface of a substrate included in the antenna member is directed toward a side surface of the electronic apparatus, and
   wherein the plurality of radiation parts of the antenna member is provided on the first surface of the substrate and disposed at predetermined intervals.

4. The electronic apparatus of claim 3, wherein the antenna member comprises:
   a radio frequency integrated circuit (RFIC) electrically connected to the plurality of radiation parts and disposed on a second surface opposite to the first surface of the substrate; and
   a shield member disposed on the second surface of the substrate and configured to shield the RFIC.

5. The electronic apparatus of claim 3, wherein the plurality of radiation parts of the antenna member is arranged in a longitudinal direction of the substrate.

6. The electronic apparatus of claim 1, wherein the plurality of radiation parts of the antenna member comprises a first radiation part, a second radiation part, a third radiation part, and a fourth radiation part, and
   wherein the reinforcement junction part is positioned between the second radiation part and the third radiation part when the electronic apparatus is viewed from a side surface.

7. The electronic apparatus of claim 6, wherein a distance between the reinforcement junction part and the second radiation part is substantially equal to a distance between the reinforcement junction part and the third radiation part when the electronic apparatus is viewed from the side surface.

8. The electronic apparatus of claim 1, wherein the frame and the plate are each made of a metallic material, and
   wherein the plurality of junction parts is parts by which the frame and the plate are coupled by welding.

9. The electronic apparatus of claim 1, wherein at least one of the plurality of junction parts comprises:
   a junction protrusion formed on one of the frame and the plate; and
   a junction groove formed in the other of the frame and the plate and provided at a position corresponding to the junction protrusion so that the junction protrusion is inserted into the junction groove.

10. The electronic apparatus of claim 9, further comprising:
    an intermediate member formed between the frame and the plate.

11. The electronic apparatus of claim 10, wherein the intermediate member is formed by injecting a forming material between the frame and the plate.

12. The electronic apparatus of claim 11, wherein a diameter of the junction protrusion of at least one of the plurality of junction parts is smaller than a diameter of the junction groove so that the forming material passes.

13. An electronic apparatus case comprising:
    a frame formed of a metal material;
    a plate disposed in the frame and formed of a metal material;
    a plurality of junction parts that comprises parts by which the frame and the plate are joined through welding; and
    an intermediate member formed between the frame and the plate,
    wherein a reinforcement junction part included in the plurality of junction parts is positioned between adjacent radiation parts among a plurality of radiation parts included in an antenna member disposed in an accommodation space provided between the frame and the plate, and
    wherein at least one of the plurality of junction parts comprises:
    a junction protrusion formed on one of the frame and the plate; and
    a junction groove formed in the other of the frame and the plate and provided at a position corresponding to the junction protrusion so that the junction protrusion is inserted into the junction groove.

14. A method of manufacturing an electronic apparatus case, the method comprising:

forming a plate and a frame;

temporarily assembling the frame to the plate so that a junction protrusion formed on one of the frame and the plate is inserted into a junction groove formed in the other of the frame and the plate;

joining the junction protrusion and the junction groove;

forming an intermediate member in a space between the frame and the plate; and machining at least one of the frame, the plate, and the intermediate member, wherein the cutting of the at least one of the frame, the plate, and the intermediate member comprises forming an accommodation space in which an antenna member is disposed between the frame and the plate, and wherein a reinforcement junction protrusion included in the junction protrusion and a reinforcement junction groove included in the junction groove is positioned between a plurality of radiation parts included in the antenna member disposed in the accommodation space, and wherein the reinforcement junction protrusion and the reinforcement junction groove are positioned between the plurality of radiation parts included in the antenna member when the case is viewed from a side surface.

15. The method of claim 14, wherein the reinforcement junction protrusion and the reinforcement junction groove are positioned between the adjacent radiation parts among the plurality of radiation parts included in the antenna member when the case is viewed from a side surface.

* * * * *